(12) United States Patent
Lin et al.

(10) Patent No.: US 12,108,596 B2
(45) Date of Patent: Oct. 1, 2024

(54) SEMICONDUCTOR MEMORY DEVICES HAVING CUP SHAPED VIAS

(71) Applicant: Taiwan Semiconductor Manufacturing Company, Ltd., Hsinchu (TW)

(72) Inventors: Meng-Han Lin, Hsinchu (TW); Chia-En Huang, Xinfeng Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 429 days.

(21) Appl. No.: 17/504,378

(22) Filed: Oct. 18, 2021

(65) Prior Publication Data

US 2023/0117185 A1   Apr. 20, 2023

(51) Int. Cl.
| | |
|---|---|
| *H10B 43/10* | (2023.01) |
| *H01L 23/48* | (2006.01) |
| *H10B 41/10* | (2023.01) |
| *H10B 41/27* | (2023.01) |
| *H10B 43/27* | (2023.01) |

(52) U.S. Cl.
CPC .......... *H10B 41/27* (2023.02); *H01L 23/481* (2013.01); *H10B 41/10* (2023.02); *H10B 43/10* (2023.02); *H10B 43/27* (2023.02)

(58) Field of Classification Search
CPC ....... H10B 43/27; H10B 41/27; H01L 23/481; H01L 23/5226
See application file for complete search history.

(56) References Cited

U.S. PATENT DOCUMENTS

2021/0175253 A1*  6/2021  Han ................ H10B 51/10

* cited by examiner

*Primary Examiner* — Eric K Ashbahian
*Assistant Examiner* — Halee Cramer
(74) *Attorney, Agent, or Firm* — FOLEY & LARDNER LLP

(57) ABSTRACT

A semiconductor device, comprises a source, and a drain spaced apart from the source in a first direction. A channel layer is disposed on radially outer surfaces of the source and the drain in a second direction orthogonal to the first direction. A memory layer is disposed on a radially outer surface of the channel layer. A via is disposed at an axial end of the drain and is configured to electrically couple the drain to a global drain line. The via comprises a via base extending in a plane defined by the first direction and a second direction perpendicular to the first direction, and structured to contact the corresponding global drain line, and via sidewalls extending from outer peripheral edges of the base towards the drain. The via defines an internal cavity within which at least a portion of the axial end of the drain is disposed.

18 Claims, 32 Drawing Sheets

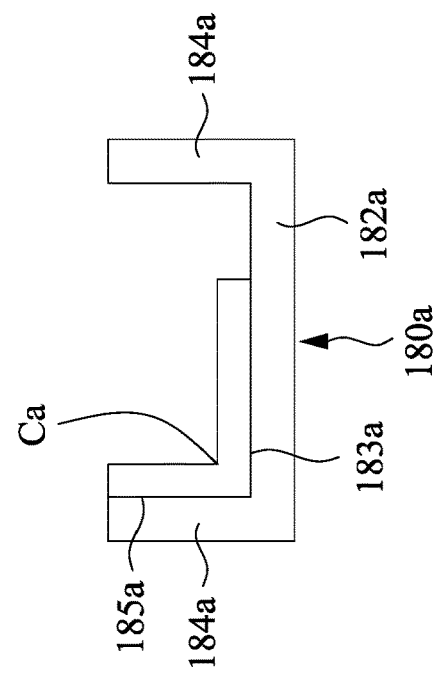
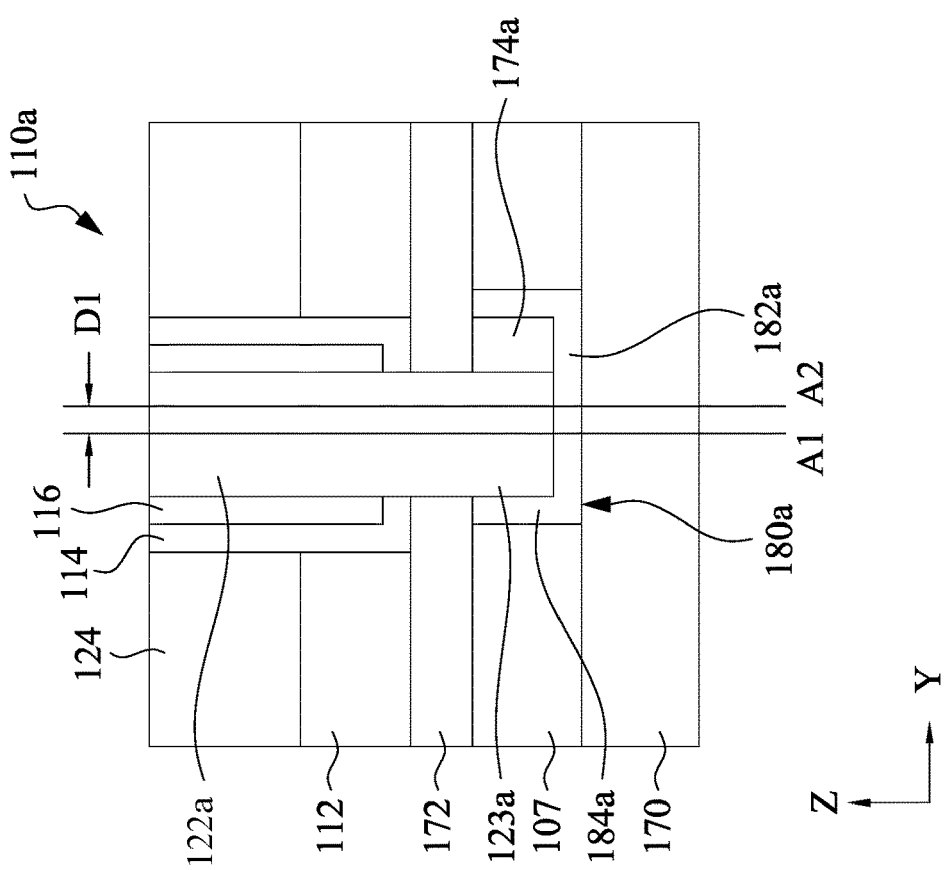
FIG. 5B
FIG. 5A

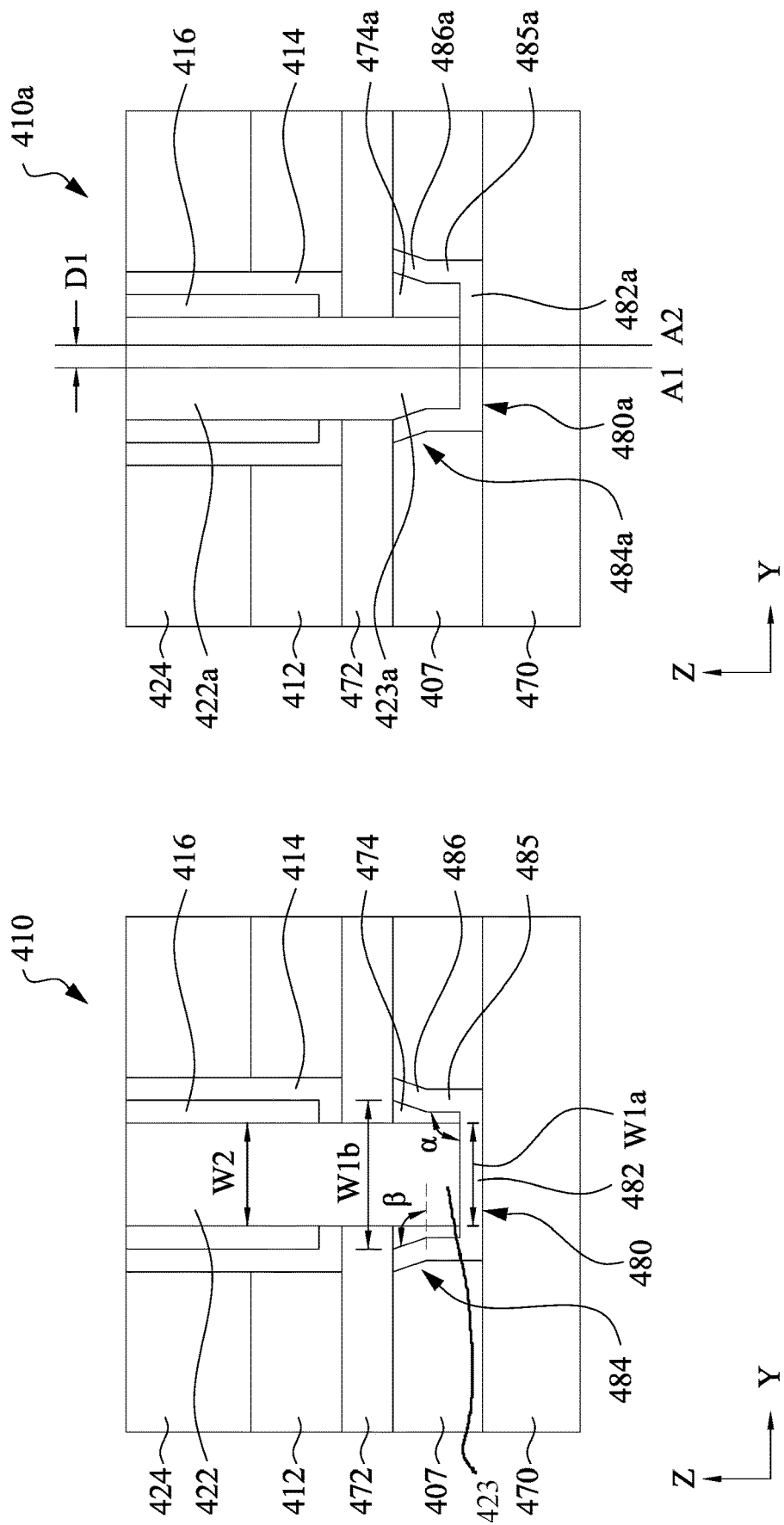

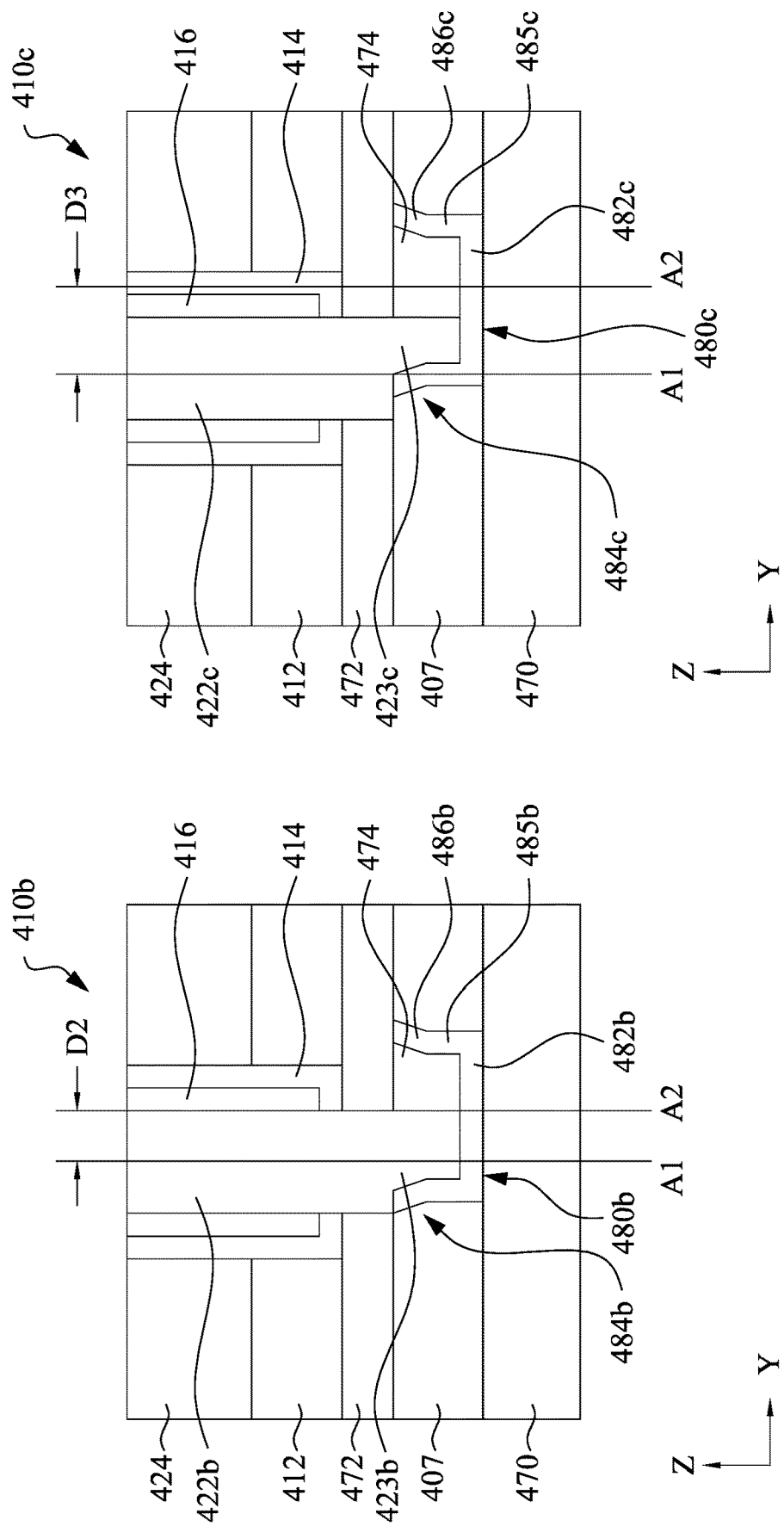

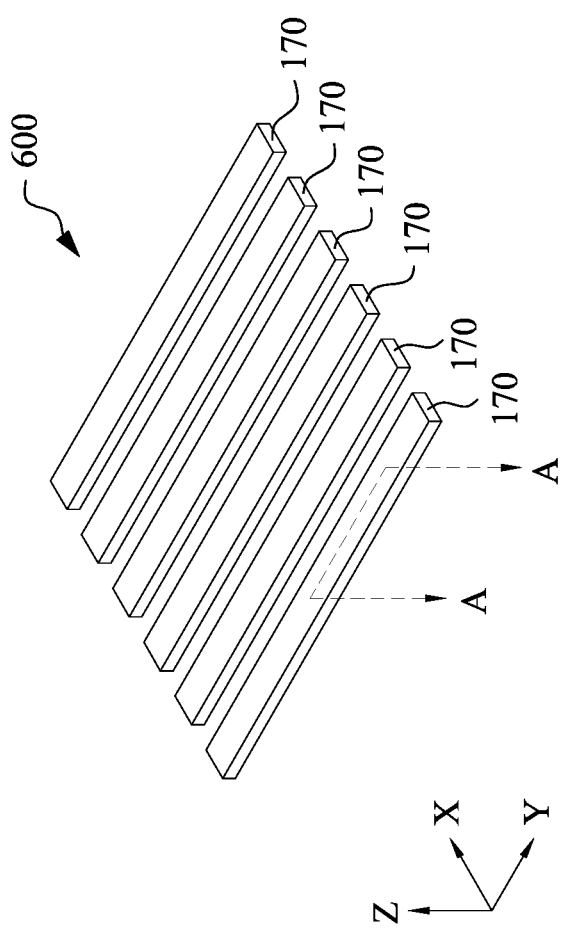
FIG. 21B
FIG. 21A

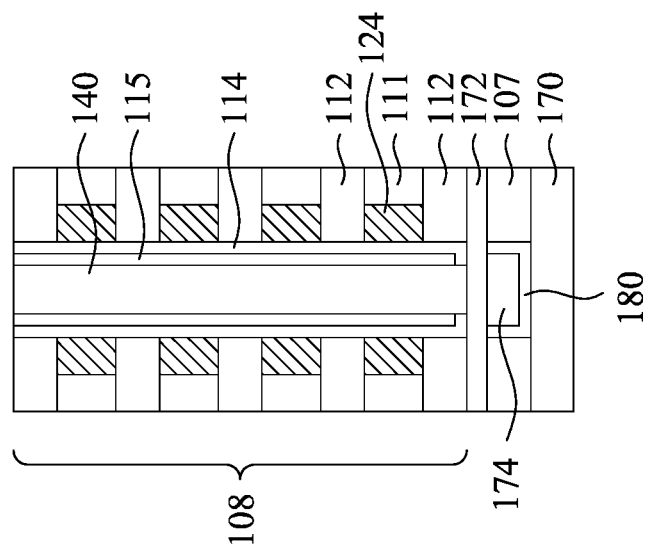
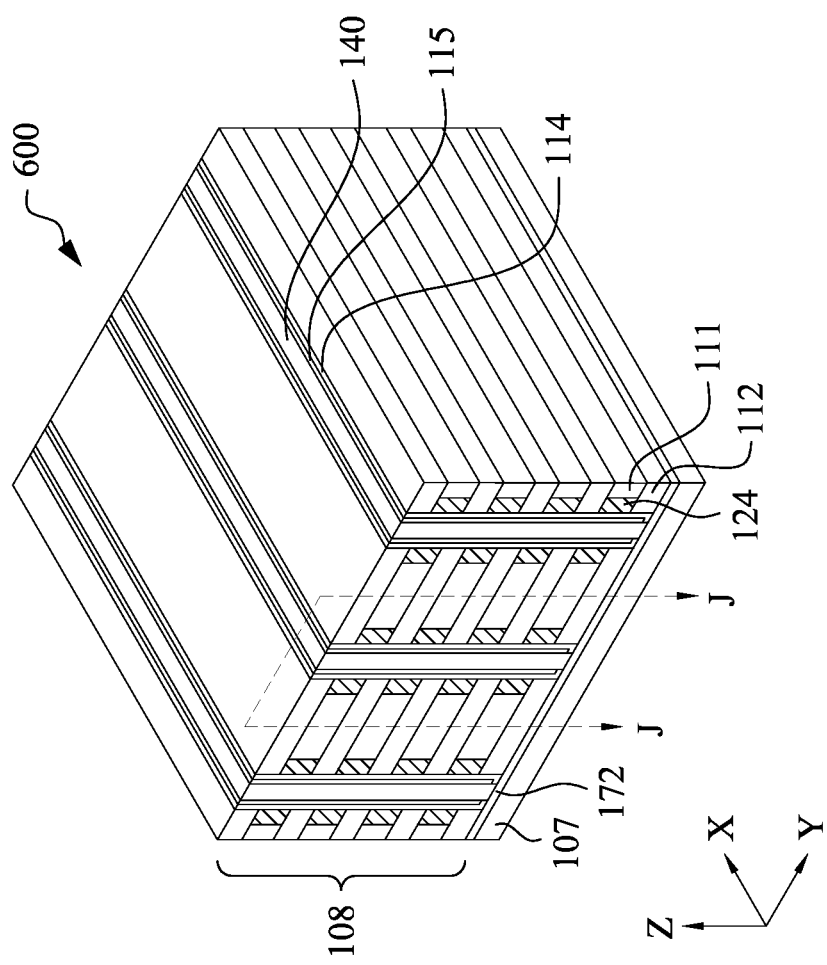
FIG. 30B
FIG. 30A

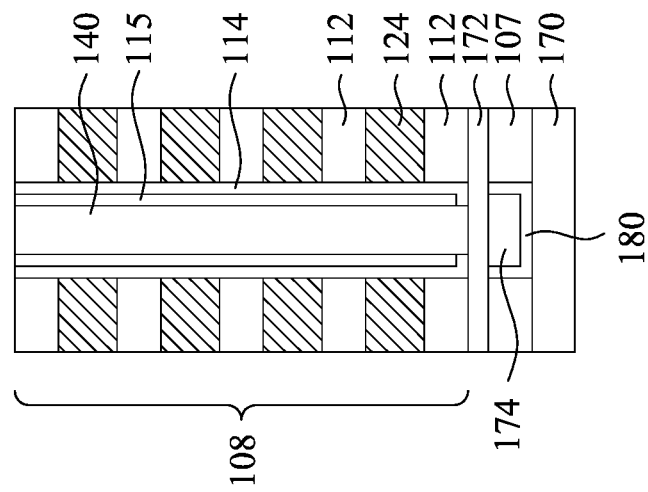
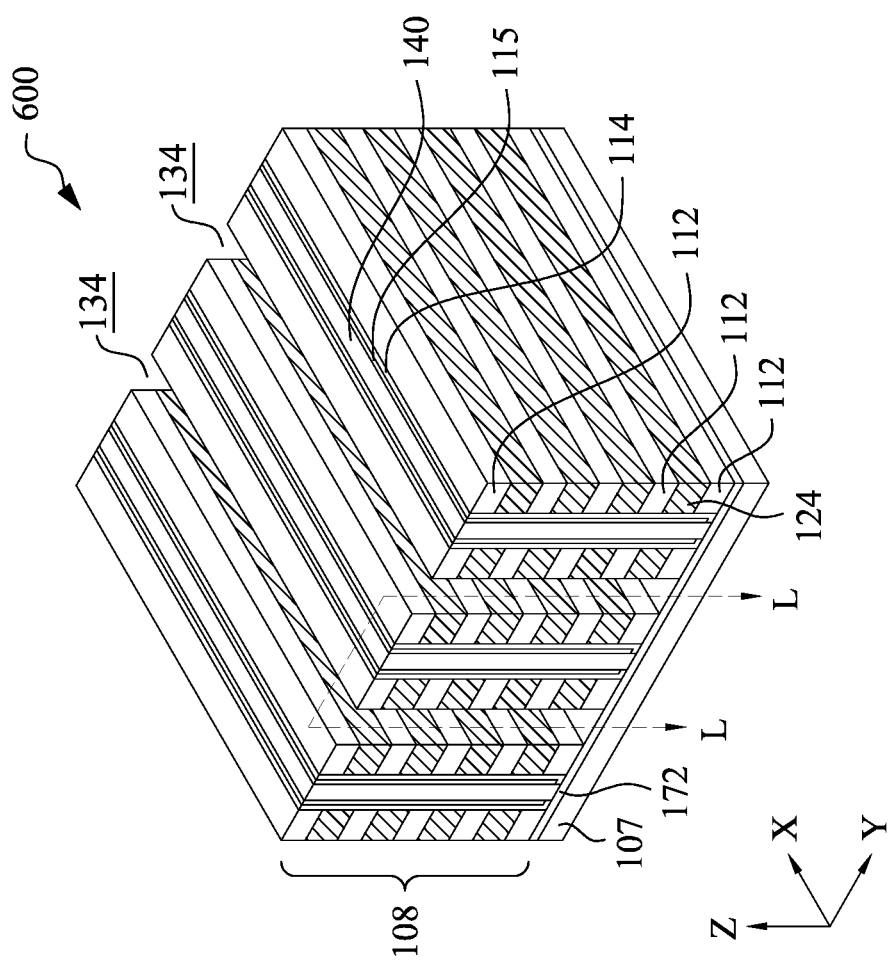
FIG. 33B
FIG. 33A

US 12,108,596 B2

1

SEMICONDUCTOR MEMORY DEVICES HAVING CUP SHAPED VIAS

BACKGROUND

The present disclosure generally relates to semiconductor devices, and particularly to methods of making a 3-dimensional (3D) memory device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A, 6A, and 7A are side cross-section view of semiconductor devices having a drain that is misaligned with a via of the semiconductor devices, according to various embodiments; FIGS. 5B, 6B, and 7B are side cross-section views of the vias of FIGS. 5A, 6A, and 7A, respectively, showing a contact area of an axial end surface of the drain with the via.

FIG. 16 is a side cross-section view of a portion of a semiconductor device having a drain that is aligned with a via of the semiconductor device, according to an embodiment.

2

FIGS. 17, 18, and 19 are side cross-section views of portion of semiconductor devices having a drain that is misaligned with a via of the semiconductor devices, according to various embodiment.

Figure 20A:
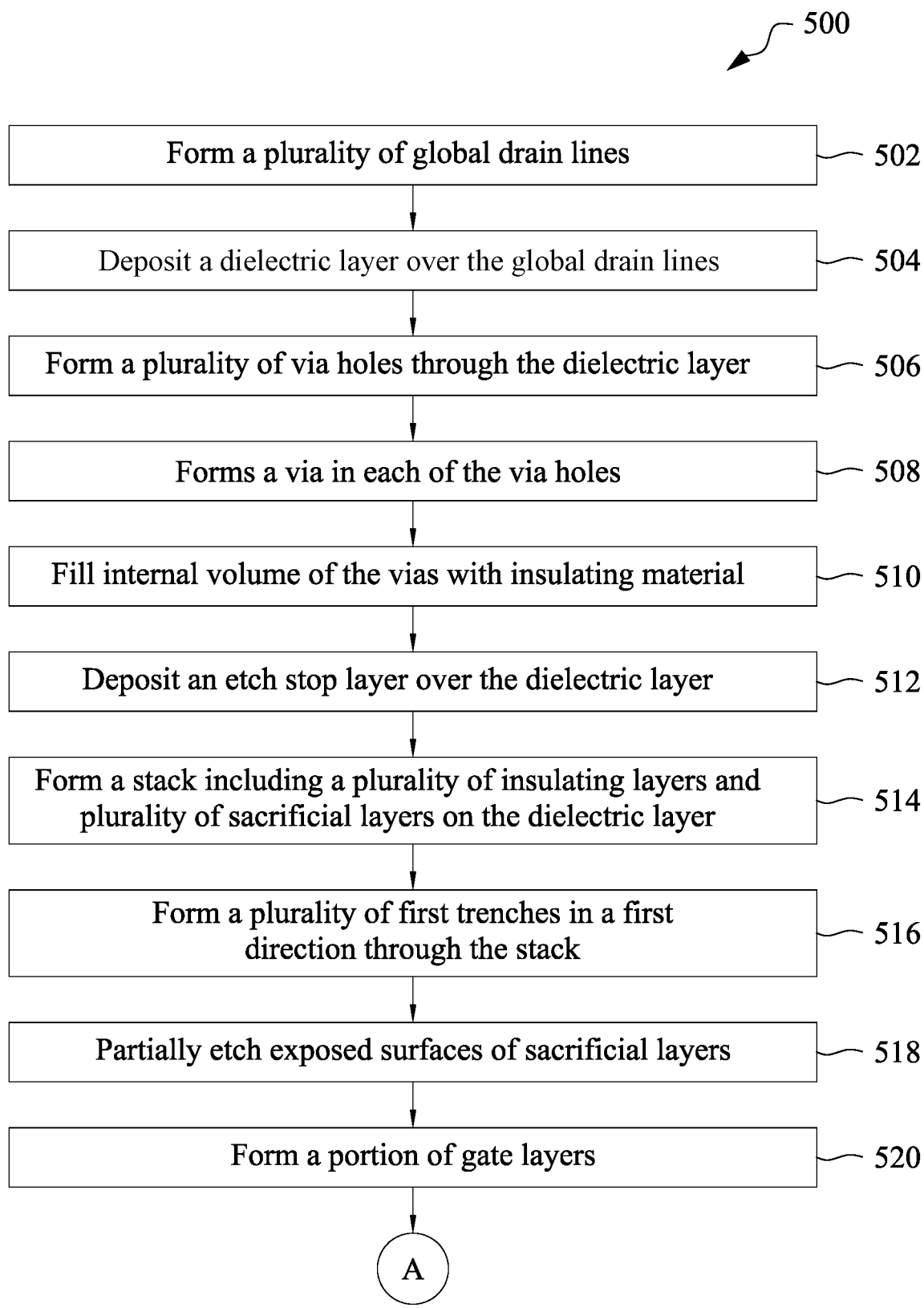
Figure 20B:
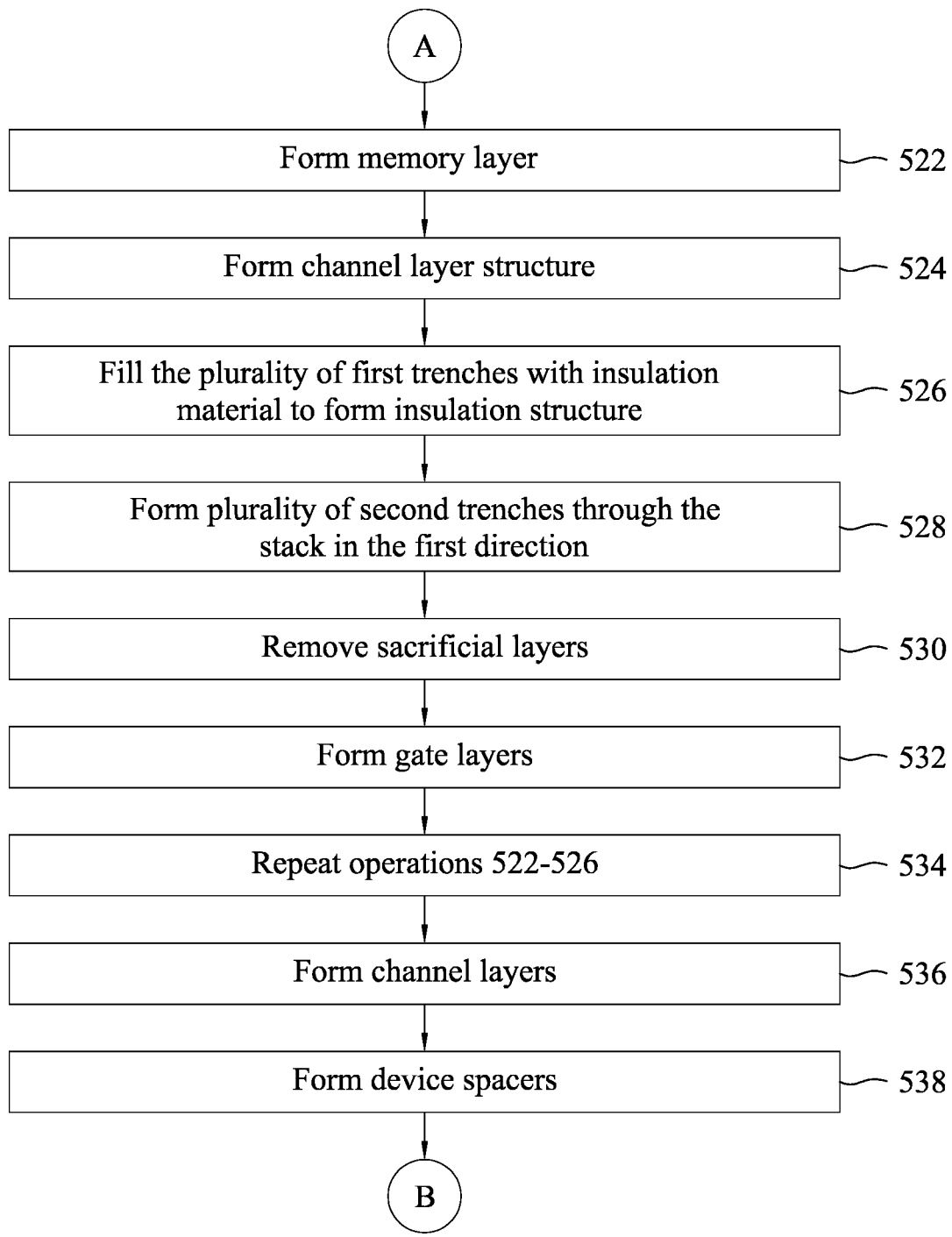
Figure 20C:
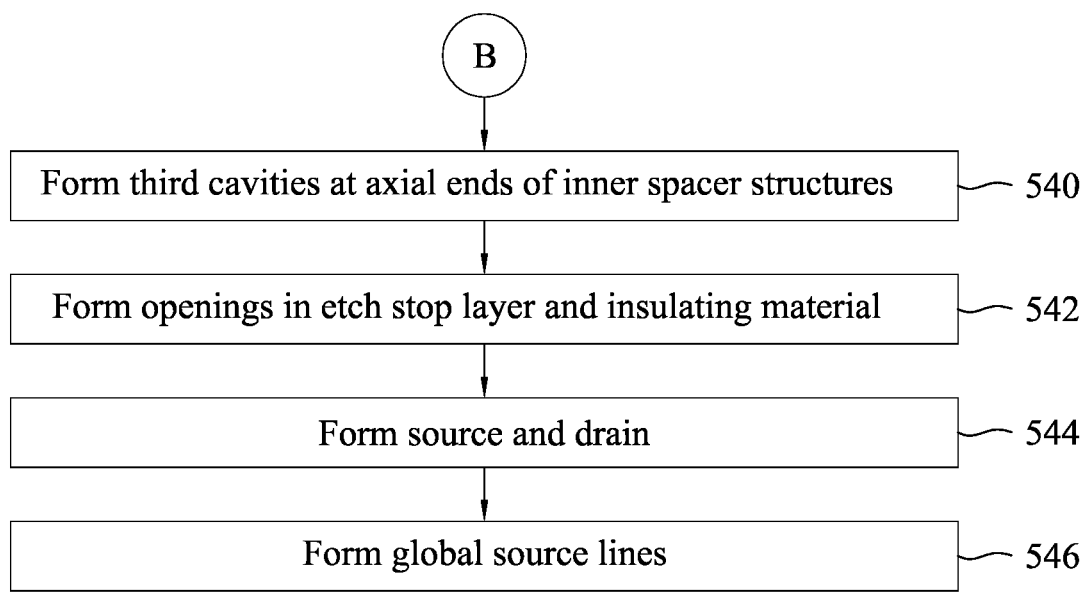

FIGS. 20A-20C are schematic flow charts of a method for forming a semiconductor die, according to an embodiment.

FIGS. 21A, 21B, 22A, 22B, 23A, 23B, 24A, 24B, 25A, 25B, 26A, 26B, 27A, 27B, 28A, 28B, 29A, 29B, 30A, 30B, 31, 32A, 32B, 33A, 33B, 34, 35, 36A, 36B, and 37 illustrate various views of an example semiconductor die (or a portion of the example semiconductor die) during various fabrication stages, made by the method of FIGS. 20A-20C, in accordance with some embodiments.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, 3D memories include an array of memory devices formed in a stack of insulating layers and gate layers, and may include a double gate or plurality of gate layers. Such double gate structures can provide a higher etching aspect ratio. The memory devices can include a source and drain. Global source lines and global drain lines (e.g., included in a complementary metal-oxide semiconductor (CMOS) circuit) are coupled to the source and drain, respectively, of such memory devices to provide electrical communication to the source and drain from an external system, for example, to allow switching of the memory devices from program mode to erase mode. Such 3D memory devices may have dimensions in the nanometer range. Because of the small dimensions, if the global source and drain lines are provided on the same surface of the semiconductor die, such lines have to be made very thin to accommodate all the global source and drain lines on the same surface, which increases manufacturing complexity and cost.

To reduce manufacturing complexity, the global drain lines can be disposed on another surface of the semiconductor die that is opposite the surface on which the global source line is disposed. This allows more space to be available on the two surfaces of the semiconductor die allowing the global source and drain lines to be made thicker, which reduces manufacturing complexity. However, in this case, the drains (or the source) has to be coupled to the corresponding global drain lines (or global source line) through the stack that can lead to misalignment of the drain with the corresponding global drain line. This can lead to open circuit between the drain and the global source line, or small contact area leading to high contact resistance.

Embodiments of the present disclosure are discussed in the context of forming a semiconductor die, and particularly in the context of forming 3D memory devices, that are formed in a stack of insulating and gate layers. For example, the present disclosure provides semiconductor dies which include a source and drain, global source lines over a top surface of a semiconductor die, and global drain lines disposed on a bottom surface of the semiconductor die formed by a dielectric layer opposite the top surface. Cup shaped vias are provided through the dielectric layer and contact the corresponding global drain lines at locations where axial ends of the drains are intended to contact the corresponding global drain lines. Advantageously, at least a portion of the vias has a larger cross-sectional width than the drain such that the vias allow tolerance for misalignment for the drain lines with the corresponding drain lines while still allowing at least a portion of the drain to contact a portion of the vias, thereby allowing electrical contact with the corresponding global drain line therethrough. Moreover, the cup like shape of the vias cause the drain to contact sidewalls of the via in case of high misalignment, which provides higher contact area between the drain and via, relative to semiconductor devices that do not include such vias, when misalignment between the drain and the corresponding via occurs. This reduces contact resistance, reduces manufacturing complexity, and reduces device failure.

Figure 1A:
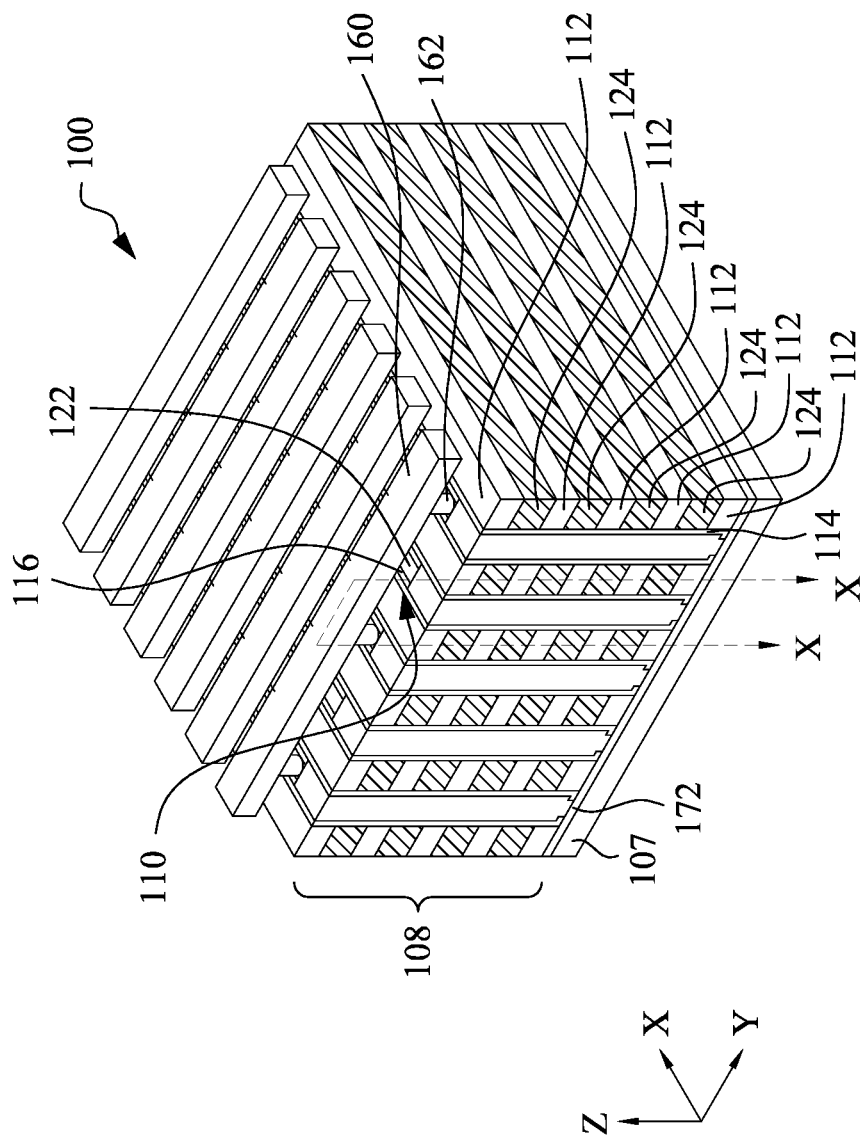
FIG. 1A is a top, perspective view of a semiconductor die including an array of semiconductor devices, according to an embodiment.
Figure 1B:
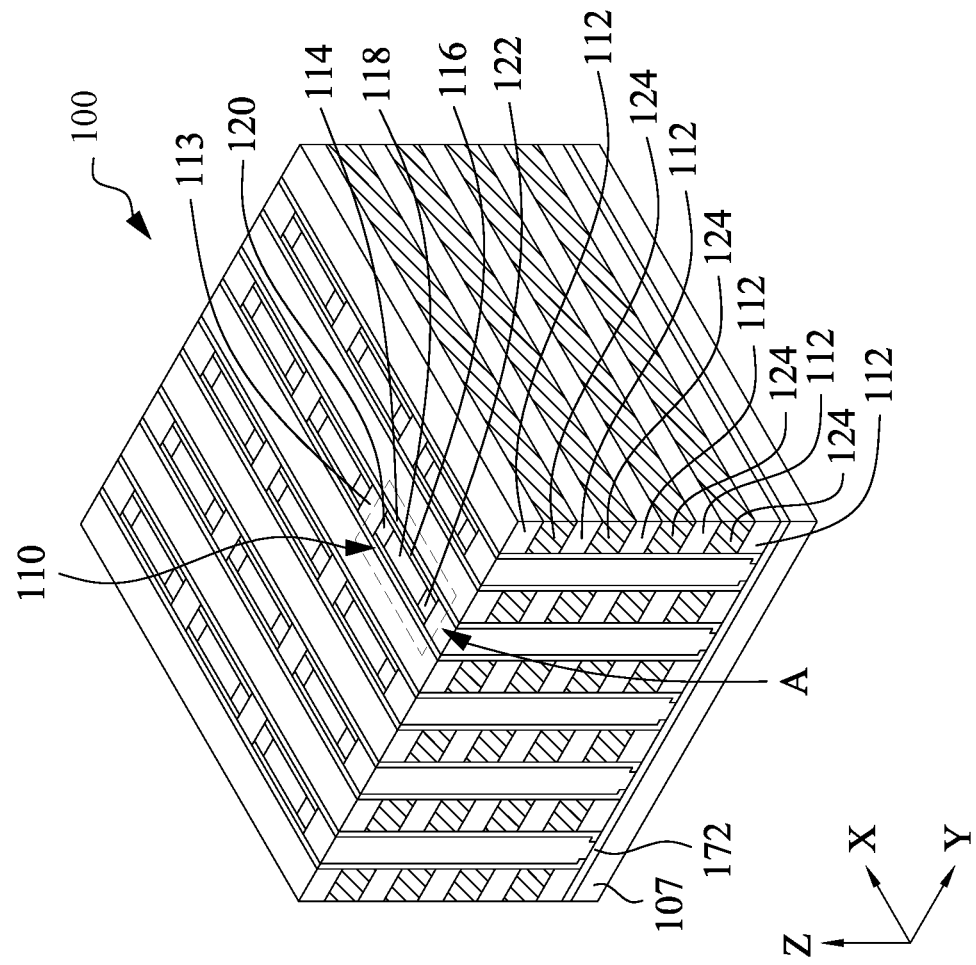
FIG. 1B is a top, perspective view of the semiconductor device of FIG. 1A with global source lines removed to show the array of semiconductor devices.

FIG. 1A is a top, perspective view of a semiconductor die 100 that includes an array of semiconductor devices 110 (e.g., memory devices), according to an embodiment. FIG. 1B shows a top, perspective view of the semiconductor device 110 with global source lines 160 removed for clarity. The semiconductor device includes a dielectric layer 107 (e.g., an intermetal dielectric (IMD) such as fluorine doped $SiO_2$, organosilicate glass (OSG), porous $SiO_2$, carbon-doped dioxide, spin-on organic polymer dielectrics, spin-silicon based polymeric dielectrics, any other suitable IMD, or a combination thereof) on which the plurality of semiconductor devices 110 are disposed. The array of semiconductor devices 110 are arranged in a plurality of rows, each of which extend in a first direction (e.g., the X direction). Each semiconductor device 110 is separated and electrically isolated from an adjacent semiconductor device 110 within a row by a device spacer 113, which may be formed from an electrically insulating material [e.g., silicon oxide ($SiO_2$), silicon nitride (SiN), silicon oxide (SiO), silicon carbide nitride (SiCN), silicon oxycarbonitride (SiOCN), silicon oxynitride (SiON), HfO2, $TaO_X$, $TiO_X$, $AlO_X$, etc.].

Figure 2:
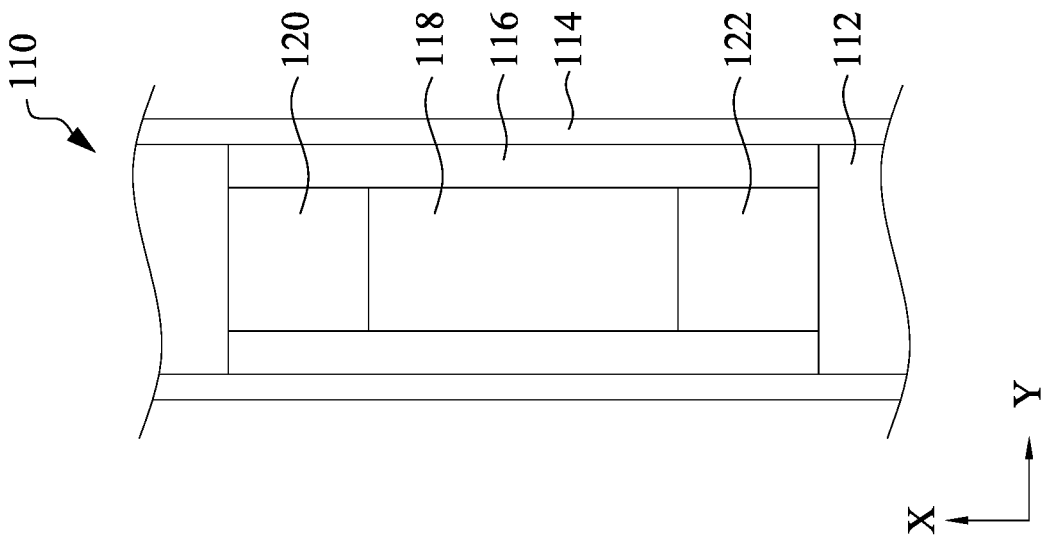
FIG. 2 is a top view of a semiconductor device of the array of semiconductor devices included in the semiconductor die of FIG. 1A-1B indicated by the arrow Ain FIG. 1B, according to an embodiment.
Figure 4:
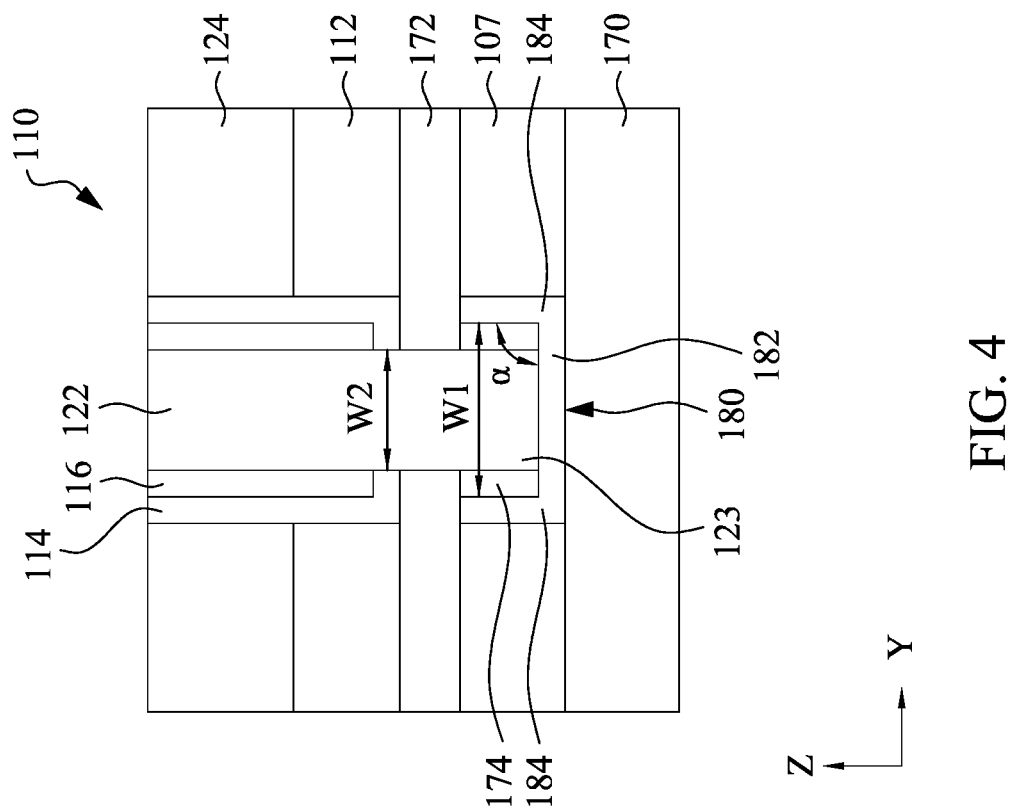
FIG. 4 is an enlarged view of a portion of the semiconductor die of FIG. 3 indicated by the arrow B in FIG. 4.
Figure 3:
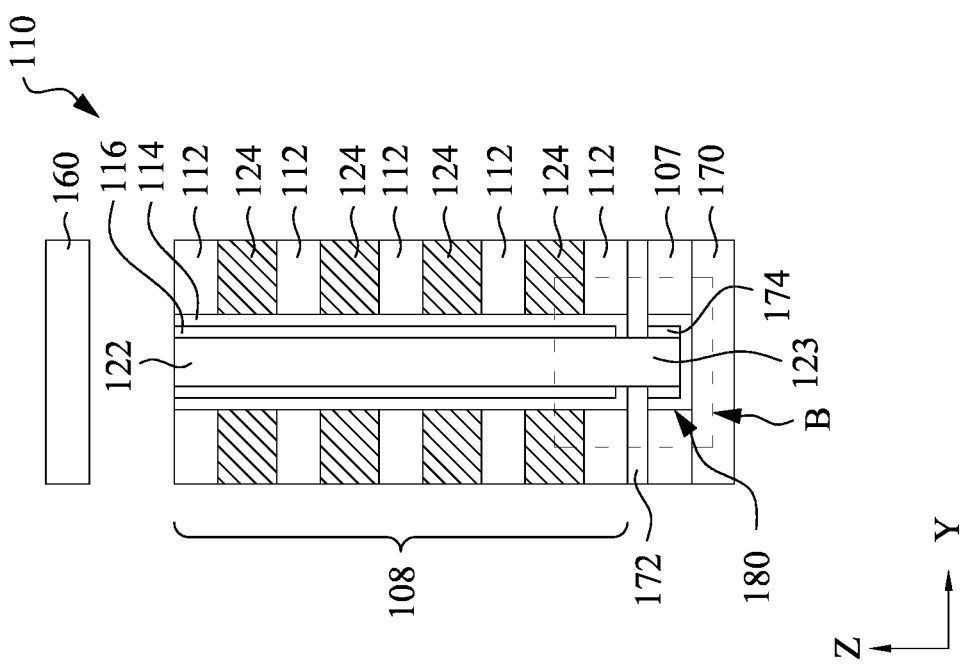
FIG. 3 is a side cross-section view of the semiconductor die of FIG. 1A taken along the line X-X in FIG. 1.

FIG. 2 is a top view of a semiconductor device 110 of the array of semiconductor devices 100 included in the semiconductor die 100 indicated by the arrow A in FIG. 1B, according to an embodiment. FIG. 3 is a side cross-section view of the semiconductor die 110 taken along the line X-X in FIG. 1, and FIG. 4 is an enlarged view of a portion of the semiconductor die 110 of FIG. 3 indicated by the arrow B in FIG. 4, each semiconductor device 110 includes a source 120, and a drain 122 spaced apart from the source 120 in a first direction (e.g., the X-direction). An inner spacer 118 is disposed between the source 120 and the drain 122. A channel layer 116 is disposed on radially outer surfaces of the source 120 and the drain 122 in a second direction (e.g., the Y-direction) orthogonal to the first direction, and extends in the first direction. A memory layer 114 is disposed on a radially outer surface of the channel layer 116 in the second direction and extends in the first direction. A via 180 is disposed at an axial end of the drain 122 in a vertical direction and configured to electrically couple the drain 122 to a corresponding global drain line 170. The semiconductor device 110 may also include a stack 108 disposed on outer surfaces of the memory layer 114 in the second direction, the stack 108 comprising a plurality of insulating layers 112 and a plurality of gate layers 124 alternatively stacked on top of each other in a vertical direction (e.g., the Z-direction), and extending in the first direction (e.g., the X-direction).

Expanding further, the source 120 and the drain 122 may include a conducting material, for example, metals such as Al, Ti, TiN, TaN, Co, Ag, Au, Cu, Ni, Cr, Hf, Ru, W, Pt, WN, Ru, any other suitable material or a combination or alloy thereof. In some embodiments, the source 120 and/or the drain 122 may include a semiconductor material, for example, an n or p-doped semiconductor such as Si, SiGe, or any other semiconductor material (e.g., IGZO, ITO, IWO, poly silicon, amorphous Si, etc.), and may be formed using a deposition process, an epitaxial growth process, or any other suitable process. The source 120 extends from a top surface of the semiconductor die 100 to the dielectric layer 107 in a vertical direction (e.g., the Z-direction).

A plurality of global drain lines 170 are disposed on a first side (e.g., a bottom side) of the dielectric layer in the vertical direction (e.g., the Z-direction). The plurality of global source lines are coupled to a portion of a plurality of vias 180 formed through the dielectric layer 107, and thereby, to corresponding drains 122 of a portion of the semiconductor devices 110, as described in further detail herein. A plurality of global source lines 160 are disposed over a top surface of the semiconductor die 100 in the vertical direction (e.g., the Z-direction) opposite the first side of the dielectric layer 107, and extend in the second direction. The global source lines 160 may be formed from conductive materials such as metals (e.g., copper, aluminum, gold, platinum, silver, chromium, titanium), any suitable conductive material or combination thereof. Source vias 162 extend from each global source line 160 to corresponding sources 120 of the semiconductor devices 110 in the vertical direction (e.g., the Z-direction) and electrically couple the global source lines 160 to corresponding sources 120.

The inner spacer 118 extends between the source 120 and the drain 122. The inner spacer 118 may be formed from an electrically insulating material, for example, silicon nitride (SiN), silicon oxide (SiO), $SiO_2$, silicon carbide nitride (SiCN), silicon oxycarbonitride (SiOCN), silicon oxynitride (SiON), HfO2, $TaO_X$, $TiO_X$, $AlO_X$, etc. The inner spacer 118 extends from a top surface of the semiconductor die 100 to the dielectric layer 107 in a vertical direction (e.g., the Z-direction).

A channel layer 116 is disposed outwards of a radially outer surface of the source 120 and the drain 122 in a second direction (e.g., the Y-direction) perpendicular to the first direction (e.g., the X-direction) and is in electrical contact with the source 120 and the drain 122. The channel layer 116 extends from a top surface of the semiconductor die 100 to the dielectric layer 107 in a vertical direction (e.g., the Z-direction). The channel layer 116 extends in the first direction (e.g., the X-direction) from an axially outward edge of the source 120 to an opposite axially outward edge of the drain 122. In some embodiments, the channel layer 116 may be formed from a semiconductor material, for example, Si (e.g., polysilicon or amorphous silicon), Ge, SiGe, silicon carbide (SiC), IGZO, ITO, ZnO, IWO, etc. and can be an n-type or p-type doped semiconductor. In the particular embodiment shown in FIGS. 1-4, each semiconductor device 110 includes a pair of channel layers 116. As shown best in FIGS. 3-4, one of the pair of channel layers 116 is disposed radially outwards of first radially outer surfaces of the source 120 and the drain 122 in the second direction (e.g., the Y-direction), and the other of the pair of channel layers 116 is disposed radially outwards of second radially outer surfaces of the source 120 and the drain 122 opposite the first radially outer surfaces. In other embodiments, each semiconductor device 110 may include a single channel layer 116 disposed radially outwards of the first or the second radially outer surfaces of the source 120 and the drain 122. In some embodiments, the channel layer 116 may include a doped material (e.g., a doped semiconductor), doped with a first concentration of a dopant (e.g., an n-type or p-type dopant).

A memory layer 114 is disposed on a radially outer surface of the channel layer 116 in the second direction (e.g., the Y-direction) and extends in the first direction (e.g., the X-direction). The memory layer 114 extends from a top surface of the semiconductor die 100 to the dielectric layer 107 in a vertical direction (e.g., the Z-direction). In some embodiments, the memory layer 114 may include a ferroelectric material, for example, lead zirconate titanate (PZT), PbZr/TiO$_3$, BaTiO$_3$, PbTiO$_2$, HfO$_2$, Hf$_{1-x}$Zr$_x$O$_2$, ZrO$_2$, TiO$_2$, NiO, TaO$_x$, Cu$_2$O, Nb$_2$O$_5$, AlO$_x$, etc. The memory layer 114 extends in the first direction (e.g., the X-direction) along the axial extent of the semiconductor die 100 in the first direction such that each semiconductor device 110 located in a row of the array of semiconductor devices 110 includes a portion of the memory layer 114, and the memory layer 114 is connected to each of the semiconductor devices 110 included in a corresponding row. In other embodiments, each of the semiconductor devices 110 includes a memory layer which extends from an axially outer edge of the source 120 to an opposite axially outer edge of the drain 122. As described with respect to the channel layer 116, while FIGS. 3-4 show two memory layers 114, a portion of each of which is included in each of the semiconductor devices 110 included in a row, in other embodiments, each semiconductor device 110 may include a single memory layer.

The semiconductor device 110 may include at least one gate layer disposed on a radially outer surface of the memory layer 114 in the second direction (e.g., the Y-direction), and extending in the first direction (e.g., the X-direction). For example, as shown in FIG. 1A-1B, the semiconductor die 100 also includes a stack 108 disposed on a second side of the dielectric layer 107 opposite the first side. The stack 108 is disposed on an outer surface of the memory layer 114, for example, on outer surfaces of each of the memory layer 114 included in each row of semiconductor devices 110, such that the stack 108 is interposed between adjacent rows of semiconductor devices 110. As shown in FIG. 1A-1B, the stack 108 includes a plurality of insulating layers 112, and a plurality of gate layers 124 alternatively stacked on top of one another in the vertical direction or the Z-direction. In some embodiments, a topmost layer and a bottommost layer of the stack 108 may include an insulating layer 112 of the plurality of insulating layers 112. The bottommost insulating layer 112 may be disposed over the dielectric layer 107, for example, on an etch stop layer 172. The insulating layer 112 may include silicon nitride (SiN), silicon oxide (SiO), SiO$_2$, silicon carbide nitride (SiCN), silicon oxycarbonitride (SiOCN), silicon oxynitride (SiON), HfO2, TaO$_x$, TiO$_x$, AlO$_x$, etc. Moreover, the gate layer 124 may be formed from a conductive material such as a metal, for example, aluminum (Al), titanium (Ti), tungsten (W), copper (Cu), cobalt (Co), TiN, tantalum nitride (TaN), silver (Ag), gold (Au), nickel (Ni), chromium (Cr), hafnium (Hf), ruthenium (Ru), platinum (Pt), tungsten nitride (WN), etc., or a high-k dielectric material, for example, hafnium oxide (HfO), tantalum oxide (TaO$_x$), TiO$_x$ etc.

While FIG. 1A-1B shows each gate layer 124 being associated with two semiconductor devices 110 located in opposite rows of the plurality of rows of the semiconductor devices 110, in other embodiments, two parallel gate layers may be located adjacent to each other in a second direction that is perpendicular to the first direction and in the same plane (e.g., the Y-direction), and may be interposed between two vertically separated insulating layers 112. Each gate layer 124 of the two parallel gate layers may be associated with a separate semiconductor devices 110, for example, each associated with a semiconductor device 110 located in rows of the semiconductor devices 110 that are parallel to each other. In some embodiments, an adhesive layer may be interposed between the gate layer/s 124 and the adjacent insulating layers 112, and facilitate adhesion of the gate layer 124 to the insulating layer 112, and may also serve as a spacer between two parallel gate layers 124 that are interposed between the same vertically separated insulating layers 112. In some embodiments, the adhesion layer (e.g., the adhesive layer) may include e.g., titanium (Ti), chromium (Cr), TiN, TaN, WN, or any other suitable adhesive material.

An etch stop layer 172 may be interposed between a bottom surface of the stack 108 and a top surface of the dielectric layer 107 in the vertical direction. The etch stop layer 172 may include an insulating material or dielectric layer that has a high etch ratio with the insulating layers 112 and the gate layers 124 included in the stack 108, the memory layer 114, the channel layer 116, or other structures that may be formed in the stack 108 during fabrication of the semiconductor die 100. Thus, the etch stop layer 172 protects the dielectric layer 107 (e.g., an IMD) and/or vias 180 formed therein from being etched during one or more processes used to etch the portions of the stack 108, the memory layer 114, the channel layer 116, or other structures formed in the stack 108. In some embodiments, an axial end of the memory layer 114 in the Z-direction is disposed on a first surface of the etch stop layer 172 that is distal from the dielectric layer 107.

Each of the drains 122 extend through the etch stop layer 172 and the dielectric layer 107 and is electrically coupled to the corresponding global drain line 170. As previously described herein, misalignment can occur between the drains 122 and the corresponding global drain line 170, for example, in the X-Y plane, which can lead to open circuit in the worst case scenario, or less contact area of the drain 122 with the corresponding global drain line 170 leading to higher contact resistance. In contrast, the semiconductor die 100 includes the plurality of vias 180 formed through the dielectric layer 107 and positioned at an axial end of the drains 122 in a vertical direction to electrically couple the drains to a corresponding global drain line 122. The vias 180 accommodate slight misalignments between the drains 122 and the corresponding global drain lines 170.

Expanding further, each of the plurality of vias 180 has a cup shape and defines an internal cavity. The vias 180 may be formed from an electrically conductive material, for example, metals such as copper, chromium, nickel, titanium, silver, gold, platinum, any other suitable conductive material or a combination thereof. As shown in FIGS. 3-4, the axial end 123 of the drain 122 extends through the stack 108, and the etch stop layer 172 to the corresponding via 180 and contacts the via 180 such that at least a portion of the axial end 123 is disposed within the internal cavity defined by the via 180. A volume of the internal cavity of the via 180 surrounding the axial end portion of the drain 122 is filled with an insulating material 174 (e.g., SiN, SiO, SiO$_2$, SiCN, SiOCN, SiON, HfO2, TaO$_X$, TiO$_X$, AlO$_X$, any other suitable material or combination thereof). In some embodiments, the insulating material 174 may include the same material used to form the insulating layers 112.

FIGS. 3-4 show the via 180 according to a particular embodiment. The via 180 includes a via base 182 extending in a plane defined by the first direction and a second direction perpendicular to the first direction (e.g., the X-Y plane), the via base 182 structured to contact the corresponding global drain line 170. Via sidewalls 184 extend from outer peripheral edges of the via base 182 towards the drain 122, i.e., axially upwards in the Z-direction, such that the via 180 defines the internal cavity within which at least the portion of the axial end 123 of the drain 122 in the Z-direction is disposed. The via sidewalls 184 are oriented at an angle α of about 90 degrees (e.g., in a range of 85 degrees to 95 degrees, inclusive) with respect to the via base 182. In other words, the via sidewalls 184 are approximately perpendicular to the via base 182.

A via width W1 of the via 180 defined by the distance between opposing via sidewalls 184 in the first direction (e.g., the X-direction) or the second direction (e.g., the Y-direction) is larger than a drain width W2 of the drain 122 in the first direction or the second direction. In other words, the via 180 has a larger width than the drain 122 which allows the via 180 to accommodate slight misalignment between the drain 122 and the corresponding global drain line 170 while still providing sufficient contact and lowering contract resistance. In some embodiments, a ratio between the via width W1 and the drain width W2 (W1:W2) is in a range of 1.1:1 to 2:1, inclusive (e.g., 1.1:1, 1.2:1, 1.4:1, 1.6:1, 1.8:1, or 2:1, inclusive). These ranges and values are just examples, and other ranges and values are contemplated and should be considered to be within the scope of this application.

FIGS. 3-4 show the drain 122 being axially aligned with the via 180 such that a center point of the drain 122 in the X-Y plane is axially aligned with a corresponding center point of the via base 182 in the X-Y plane. In such embodiments, radially outer surfaces of the drain 122 are disposed radially inwards of the via sidewalls 184 such that the axial end 123 of the drain 122 is located within the internal cavity defined by the via 180 and an axial end surface of the axial end 123 is in contact with a surface of the via base 182.

In other embodiments, the drain 122 may be misaligned or axially offset from the via 180 (or any other via described herein). In some embodiments, a drain may be axially offset from a via such that a radially outer surface of the drain contacts at least one of the via sidewalls. For example, FIG. 5A shows a side cross-section view of a portion of a semiconductor device 110a that includes a bottom region of a drain 122a and a via 180a of the semiconductor device 110a, according to an embodiment. The semiconductor device 110a includes the stack 108 including the plurality of insulating layers 112 and gate layers 124, channel layer 116, memory layers 114, a source (not shown), and the drain 122a, the etch stop layer 172, the dielectric layer 107, and the via 180a. The global drain line 170 is coupled to the via 180a. The via 180a includes a via base 182a and via sidewalls 184b extending axially upwards towards the drain 122a about perpendicular to the via base 182a. The via 180a may be substantially similar to the via 180, previously described herein.

A first axis A1 extending in a vertical direction (e.g., the Z-direction) through a central point of the drain 122a in the X-Y plane, is axially offset from a second axis A2 extending in the vertical direction (e.g., the Z-direction) through a central point of the via base 182a by a first distance D1. This causes a portion of an outer radial surface of an axial end 123a of the drain 122a to contact an inner surface of the via sidewall 184a in the X-Y plane. FIG. 5B shows a contact area Ca of the axial end 123a of the drain 122a with the via 180a that were shown in FIG. 5A. An axial end surface of the axial end 123a contacts a portion of an axially inward surface 183a of the via base 182a, and a radially outer surface of the axial end 123a contacts a radially inward surface 185a of one or two of the via sidewalls 184a in the X-Y plane. Thus, even with the drain 122a being axially offset form the via 180a, a large contact area is achieved, which reduces contact resistance. The remaining portion of an internal cavity of the via 180a is filled with an insulating material 174a.

Figure 6B:
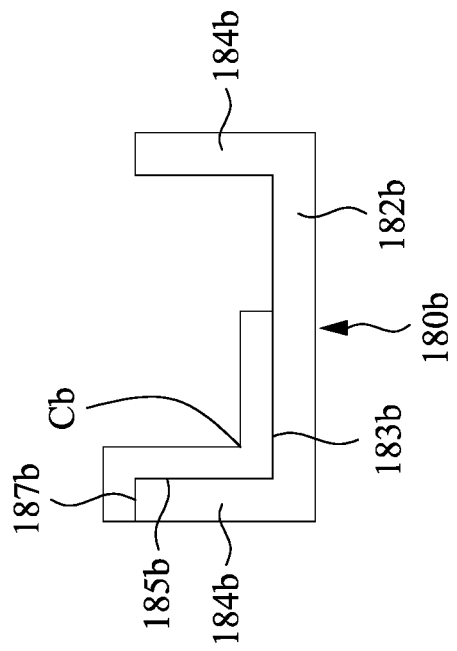
Figure 6A:
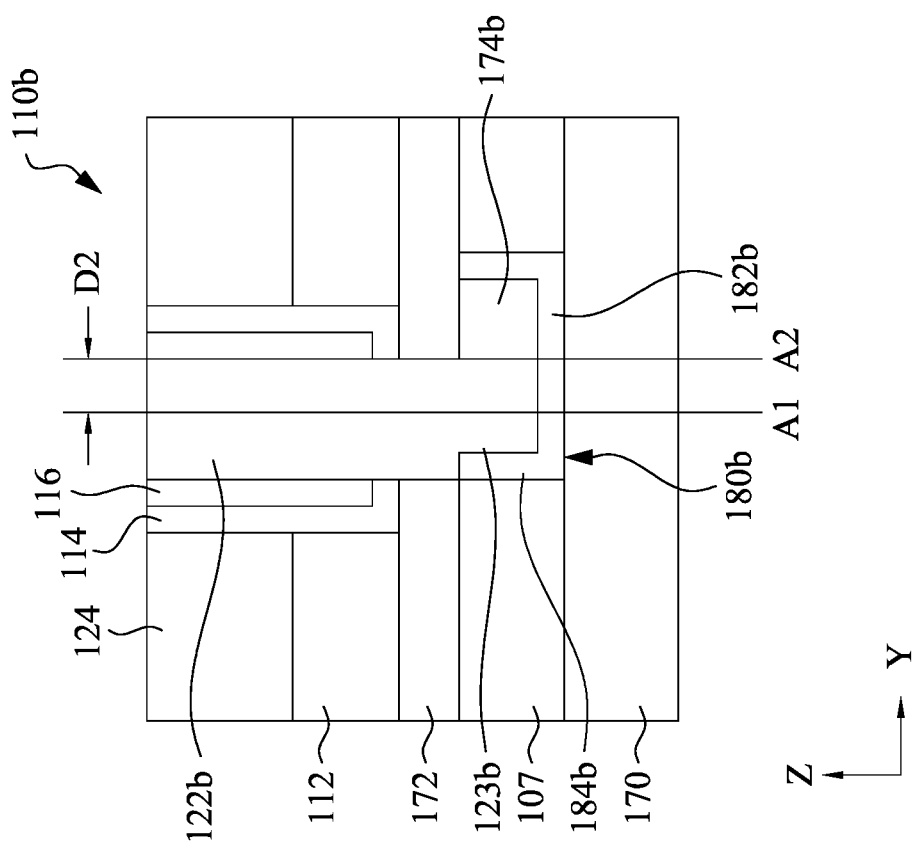

In some embodiments, a drain may be axially offset from a via such that a portion of an axial end surface of the drain is disposed on and contacts an axial end surface of the at least one of the via sidewalls that is distal from the via base. For example, FIG. 6A shows a side cross-section view of a portion of the semiconductor device 110b that includes a bottom region of a drain 122b and a via 180b of the semiconductor device 110b, according to another embodiment. The semiconductor device 110b includes the stack 108 including the plurality of insulating layers 112 and gate layers 124, channel layer 116, memory layers 114, a source (not shown), and the drain 122b, the etch stop layer 172, the dielectric layer 107, and the via 180b. The global drain line 170 is coupled to the via 180b. The via 180b includes a via base 182b and via sidewalls 184b extending axially upwards towards the drain 122b about perpendicular to the via base 182a. The via 180b may be substantially similar to the via 180, previously described herein.

A first axis A1 extending in a vertical direction (e.g., the Z-direction) through a central point of the drain 122b in the X-Y plane, is axially offset from a second axis A2 extending in the vertical direction (e.g., the Z-direction) through a central point of the via base 182b by a second distance D2 that is larger than the first distance D1 of the semiconductor device 110a. This causes a portion of an outer radial surface of an axial end 123b of the drain 122b to contact an inner surface of the via sidewall 184b in the X-Y plane, as well as portion of an axial end surface of the drain 122b to contact an axial end of the corresponding via sidewall 184b. FIG. 6B shows a contact area Cb of the axial end 123b of the drain 122b with the via 180b which may be about equal to the contact area Ca described with respect to the semiconductor device 110a. A first portion of an axial end surface of the axial end 123b contacts a portion of an axially inward surface 183b of the via base 182b. A radially outer surface of the axial end 123b contacts a radially inward surface 185b of one or two of the via sidewalls 184b in the X-Y plane. A second portion of the axial end surface of the axial end 123b is disposed on and contacts an axial end surface 187b of the corresponding via sidewall 184b. The remaining portion of an internal cavity of the via 180b is filled with an insulating material 174b.

Figure 7B:
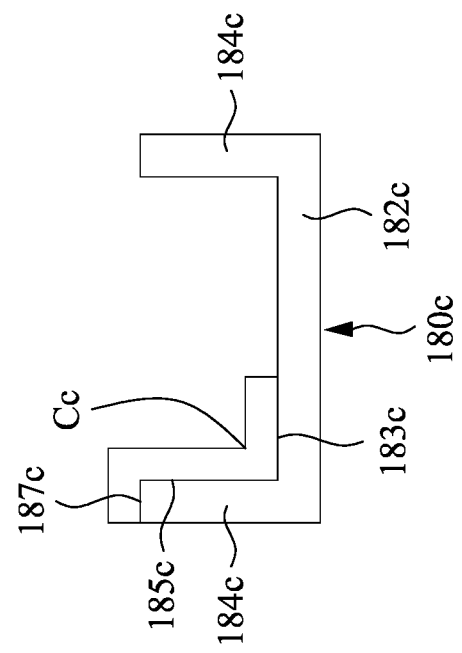
Figure 7A:
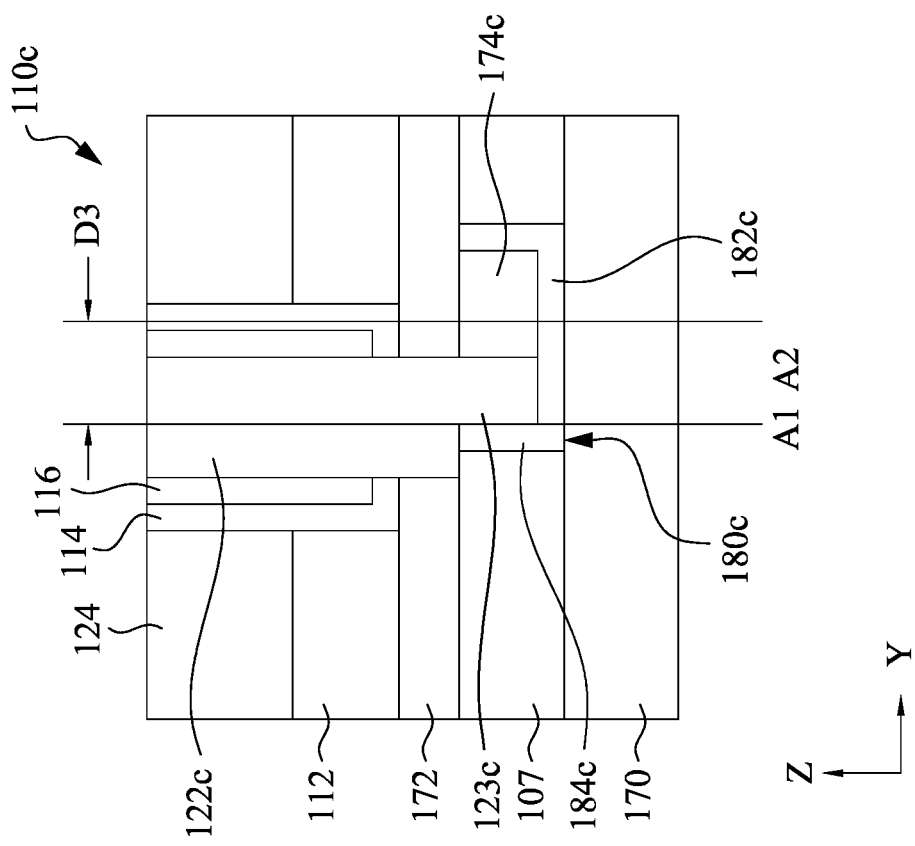

A radial outer extent of the drain 122b is axially aligned with or radially inwards of an axially outwards extent of the via 180b (i.e., a radially outer surface of the via sidewalls 184b). In other embodiments, a drain may be misaligned such that a radial outer extent of the drain extends beyond a radial outer extent of the via. For example, FIG. 7A shows a side cross-section view of a portion of the semiconductor device 110c that includes a bottom region of a drain 122c and a via 180c of the semiconductor device 110c, according to another embodiment. The semiconductor device 110c includes the stack 108 including the plurality of insulating layers 112 and gate layers 124, channel layer 116, memory layers 114, a source (not shown), and the drain 122c, the etch stop layer 172, the dielectric layer 107, and the via 180c. The global drain line 170 is coupled to the via 180c. The via 180c includes a via base 182c and via sidewalls 184c extending axially upwards towards the drain 122c about perpendicular to the via base 182c. The via 180c may be substantially similar to the via 180, previously described herein.

A first axis A1 extending in a vertical direction (e.g., the Z-direction) through a central point of the drain 122c in the X-Y plane, is axially offset from a second axis A2 extending in the vertical direction (e.g., the Z-direction) through a central point of the via base 182c by a third distance D3 that is larger than the second distance D2 of the semiconductor device 110b. This causes a portion of an outer radial surface of an axial end 123c of the drain 122c to contact an inner surface of the via sidewall 184c in the X-Y plane, a portion of an axial end surface of the drain 122c to contact an axial end of the corresponding via sidewall 184c, and another portion of the axial end surface of the axial end 123c to extend radially outward of the via 180c and contact the dielectric layer 107. FIG. 7B shows a contact area Cc of the axial end 123c of the drain 122c with the via 180c that is smaller than the contact areas Ca and Cb. A first portion of an axial end surface of the axial end 123c contacts a portion of an axially inward surface 183c of the via base 182c. A radially outer surface of the axial end 123c contacts a radially inward surface 185c of one or two of the via sidewalls 184c in the X-Y plane. A second portion of the axial end surface of the axial end 123c is disposed on and contacts an axial end surface 187c of the corresponding via sidewall 184c. Mover, a radial outer extent of the drain 122c extends beyond a radial outer extent of the via 180c such that a third portion of the axial end surface of the axial end 123c of the drain 122c is disposed on the dielectric layer 107 and does not contact the via 180c. However, even with such a substantial misalignment and contact area Cc being smaller than Ca and Cb, the contact of the radially outer surface of the axial end 123c with the radially inner surface of the via sidewall 184c provides sufficient contact area Cc to inhibit substantial increase in contact resistance. The remaining portion of an internal cavity of the via 180c is filled with an insulating material 174c.

Figure 8:
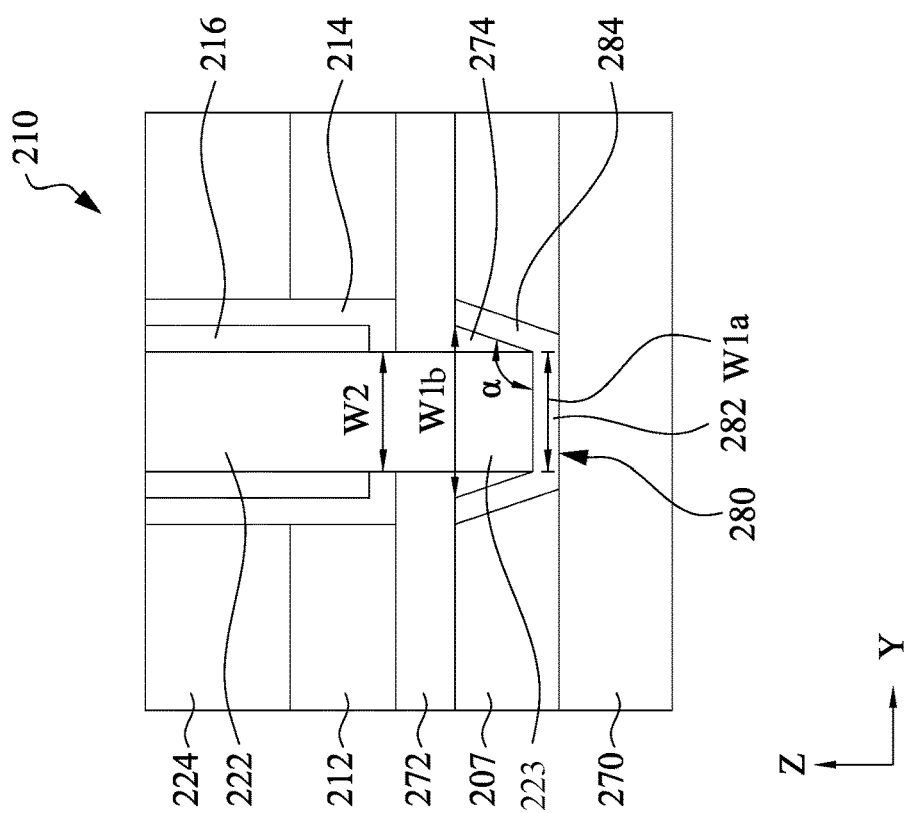
FIG. 8 is a side cross-section view of a portion of a semiconductor device having a drain that is aligned with a via of the semiconductor device, according to an embodiment.

FIG. 8 is a side cross-section view of a portion of a semiconductor device 210, according to another embodiment. The semiconductor device 210 may be substantially similar to the semiconductor device 110 in structure and function and includes a stack (e.g., the stack 108) having a plurality of insulating layers 212 and gate layers 224, channel layers 216, memory layers 214, an etch stop layer 272, a dielectric layer 207, a source (not shown), a drain 222, and a via 280. A global drain line 270 is coupled to the via 280. The insulating layers 212, the gate layers 224, the channel layers 216, the memory layers 214, the etch stop layer 272, the dielectric layer 207, the global drain lines 270, the source and the drain 222 may be substantially similar to the insulating layers 112, the gate layers 124, the channel layers 116, the memory layers 114, the etch stop layer 172, the dielectric layer 107, the global drain lines 170, the source 120 and the drain 122, respectively.

The via 280 includes a via base 282 extending in a plane defined by the first direction and a second direction perpendicular to the first direction (e.g., the X-Y plane), the via base 282 structured to contact the corresponding global drain line 270. Different form the via 180, via sidewalls 284 extend from outer peripheral edges of the via base 282 towards the drain 222 at an outward angle from the via base 282, i.e., axially upwards and outwards in the Z-direction, such that the via 280 defines the internal cavity within which at least the portion of the axial end 223 of the drain 122 in the Z-direction is disposed. More specifically, the via sidewalls 284 are oriented at an angle α of greater than 90 degrees, for example, in a range of 95 degrees to 160 degrees, inclusive with respect to the via base 282.

A via first width W1a of the via 280 defined by a width of the via base 282 may be about equal to or larger than a drain width W2 of the drain in the X-plane or the Y-plane. A via second width W1b defined by a distance between axial ends of opposing via sidewalls 284, which are distal from the via base 282 in the first direction (e.g., the X-direction) or the second direction (e.g., the Y-direction) is larger than the drain width W2 of the drain 122 in the first direction or the second direction.

The inclined via sidewalls 284 may facilitate contact of the drain 222 with an inner surface of the via sidewalls 284, and provide a larger contact area relative to the via 180, when misalignment occurs. In some embodiments, a first ratio between the via first width W1a and the drain width W2 (W1a:W2) may be in a range of 1:1 to 1.2:1, inclusive. In some embodiments, a second ratio between the via second width W1b and the drain width W2 (W1b:W2) is in a range of 1.1:1 to 2:1, inclusive (e.g., 1.1:1, 1.2:1, 1.4:1, 1.6:1, 1.8:1, or 2:1, inclusive). These ranges and values are just examples, and other ranges and values are contemplated and should be considered to be within the scope of this application.

FIG. 8 shows the drain 222 being axially aligned with the via 280 such that a center point of the drain 222 in the X-Y plane is axially aligned with a corresponding center point of the via base 282 in the X-Y plane. In such embodiments, radially outer surfaces of the drain 222 are disposed radially inwards of the via sidewalls 284 such that the axial end 223 of the drain 222 is located within the internal cavity defined by the via 280 and an axial end surface of the axial end 223 is in contact with a surface of the via base 282 to form a contact area between and axial end surface of the drain 222 and the via 280.

Figure 9:
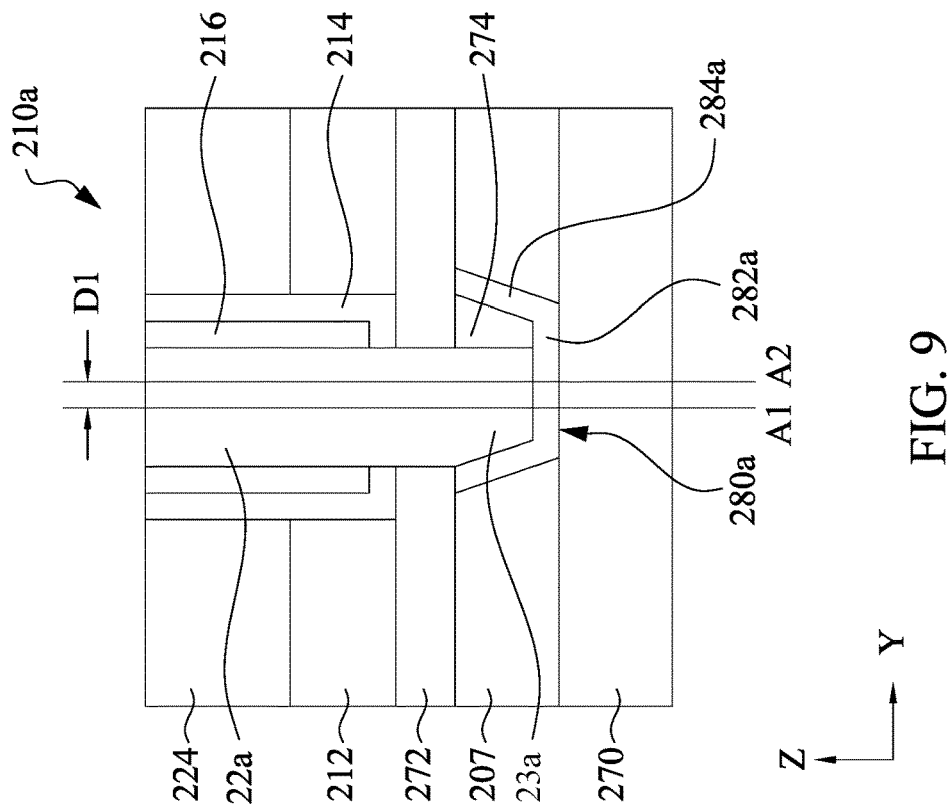
FIGS. 9, 10, and 11 are side cross-section views of a portion of semiconductor devices having a drain that is misaligned with a via of the semiconductor device, according to various embodiment.

In other embodiments, the drain 222 may be misaligned or axially offset form the via 280 (or any other via described herein). For example, FIG. 9 shows a side cross-section view of a portion of the semiconductor device 210a, according to an embodiment. The semiconductor device 110a includes the stack including the plurality of insulating layers 212 and gate layers 224, channel layers 214, memory layers 214, a source (not shown), and a drain 222a, the etch stop layer 272, the dielectric layer 207, and a via 280a. A global drain line 270 is coupled to the via 280a. The via 280a includes a via base 282a and via sidewalls 284b extending axially upwards towards the drain 222a at an angle of greater than 90 degrees with respect to the via base 282a. The via 280a may be substantially similar to the via 280, previously described herein.

A first axis A1 extending in a vertical direction (e.g., the Z-direction) through a central point of the drain 222a in the X-Y plane, is axially offset from a second axis A2 extending in the vertical direction (e.g., the Z-direction) through a central point of the via base 282a by a first distance D1. This causes a portion of an outer radial surface of an axial end 223a of the drain 222a to contact an inner surface of the via sidewall 284a in the X-Y-Z plane. The remaining portion of an internal cavity of the via 280a is filled with an insulating material 274a. A contact area between an axial end surface of the drain 222a and the via 280a may be equal to or less than the contact area between the drain 222 and via 280 of the semiconductor device 210.

Figure 10:
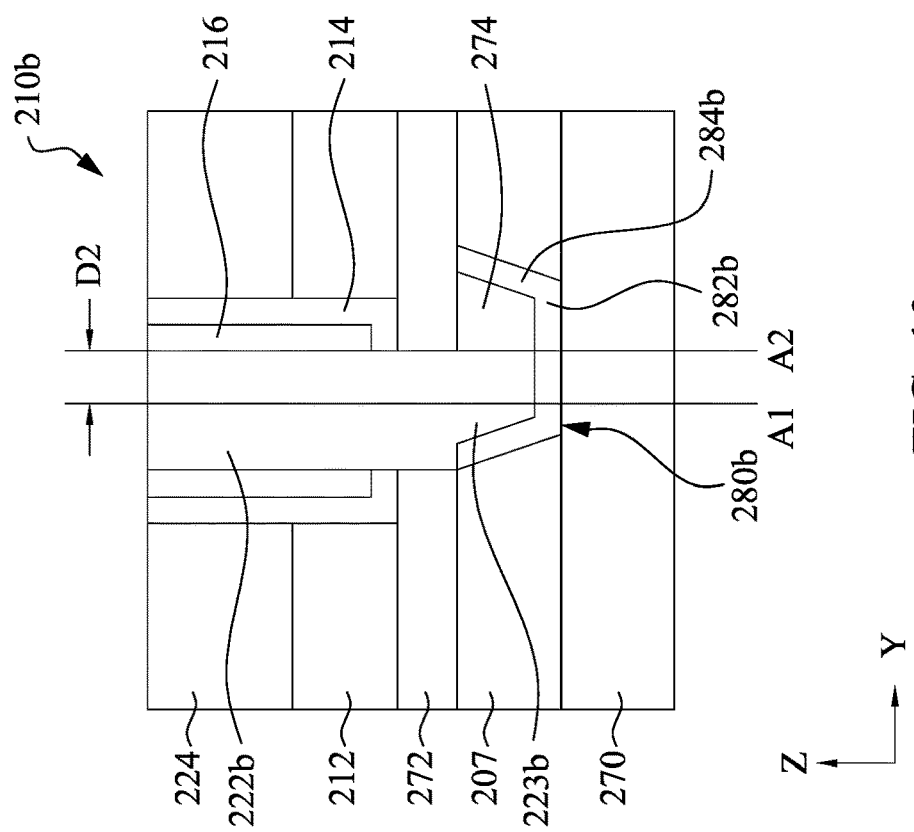

FIG. 10 shows a side cross-section view of a portion of the semiconductor device 210b, according to another embodiment. The semiconductor device 210b includes the stack including the plurality of insulating layers 212 and gate layers 224, channel layer 216, memory layers 214, a source (not shown), and a drain 222b, the etch stop layer 272, the dielectric layer 207, and a via 280b. A global drain line 270 is coupled to the via 280b. The via 280b includes a via base 282b and via sidewalls 284b extending towards the drain 222b at an angle of greater than 90 degrees with respect to the via base 282b. The via 280b may be substantially similar to the via 280, previously described herein.

A first axis A1 extending in a vertical direction (e.g., the Z-direction) through a central point of the drain 222b in the X-Y plane, is axially offset from a second axis A2 extending in the vertical direction (e.g., the Z-direction) through a central point of the via base 282b by a second distance D2 that is larger than the first distance D1 of the semiconductor device 210a. This causes a portion of an outer radial surface of an axial end 223b of the drain 222b to contact an inner surface of the via sidewall 284b in the X-Y-Z plane, as well as portion of an axial end surface of the drain 222b to contact an axial end of the corresponding via sidewall 284b. A contact area between an axial end surface of the drain 222b and the via 280b may be equal to or less than the contact area between the drain 222/222a and via 280/280a of the semiconductor device 210/210a.

Figure 11:
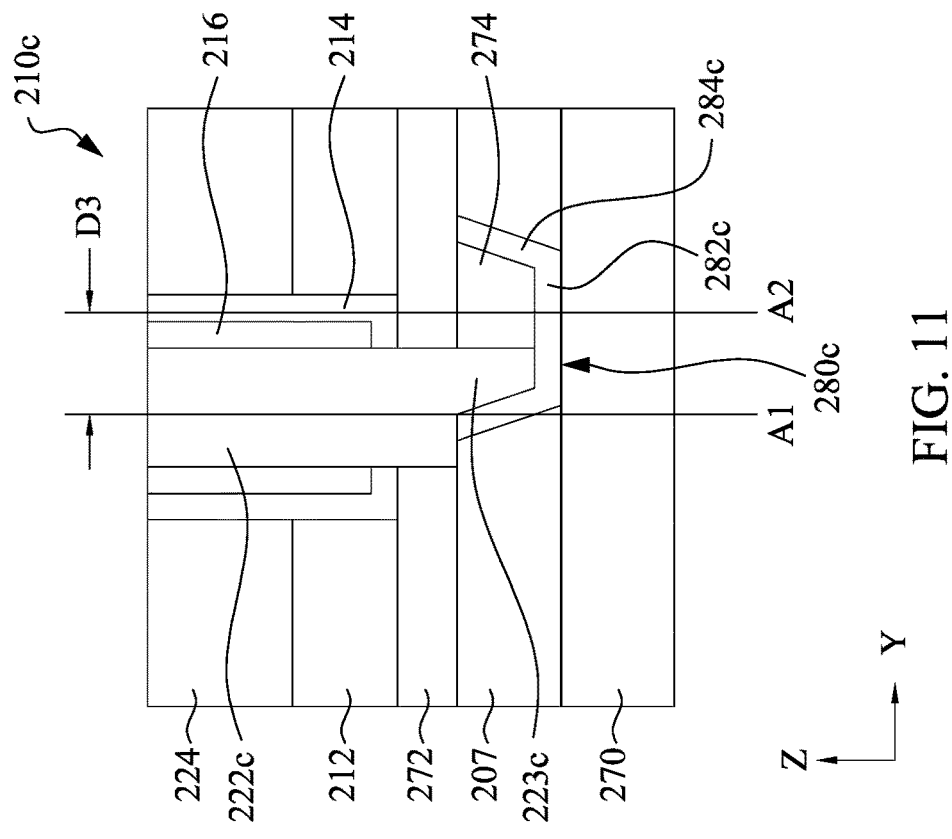

A radial outer extent of the drain 222b is axially aligned with or radially inwards of an axially outwards extent of the via 280b (i.e., a radially outer surface of the via sidewalls 184b). In other embodiments, a drain may be misaligned such that a radial outer extent of the drain extends beyond a radial outer extent of the via. For example, FIG. 11 shows a side cross-section view of a portion of the semiconductor device 210c, according to another embodiment. The semiconductor device 210c includes the stack including the plurality of insulating layers 212 and gate layers 224, channel layer 216, memory layers 214, a source (not shown), and a drain 222c, the etch stop layer 272, the dielectric layer 207, and a via 280c. A global drain line 270 is coupled to the via 280c. The via 280c includes a via base 282c and via sidewalls 284c extending towards the drain 222c at an angle of greater than 90 degrees with respect to the via base 282c. The via 280c may be substantially similar to the via 280, previously described herein.

A first axis A1 extending in a vertical direction (e.g., the Z-direction) through a central point of the drain 222c in the X-Y plane, is axially offset from a second axis A2 extending in the vertical direction (e.g., the Z-direction) through a central point of the via base 282c by a third distance D3 that is larger than the second distance D2 of the semiconductor device 210b. This causes a portion of an outer radial surface of an axial end 223c of the drain 222c to contact an inner surface of the via sidewall 284c in the X-Y-Z plane, a portion of an axial end surface of the drain 222c to contact an axial end of the corresponding via sidewall 284c, and another portion of the axial end surface of the axial end 223c to extend radially outward of the via 280c and contact the dielectric layer 207. The remaining portion of an internal cavity of the via 280c is filled with an insulating material 274c. A contact area between an axial end surface of the drain 222c and the via 280c is less than the contact area between the drain 222/222a/222b and via 280/280a/290b of the semiconductor device 210/210a/210b.

Figures 12, 13:
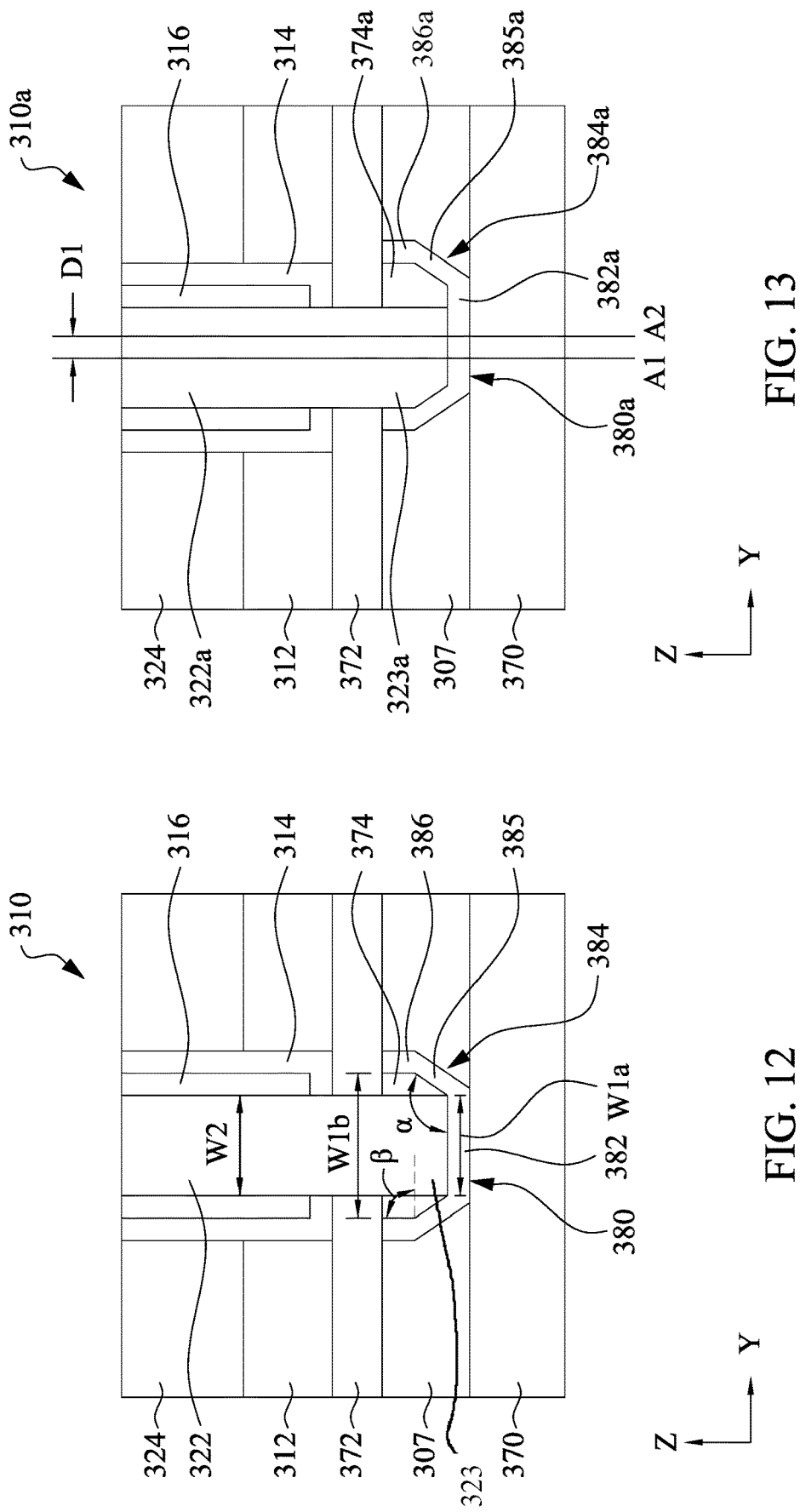
FIG. 12 is a side cross-section view of a portion of a semiconductor device having a drain that is aligned with a via of the semiconductor device, according to an embodiment.
FIGS. 13, 14, and 15 are side cross-section views of portion of semiconductor devices having a drain that is misaligned with a via of the semiconductor devices, according to various embodiment.

FIG. 12 is a side cross-section view of a portion of a semiconductor device 310, according to still another embodiment. The semiconductor device 310 may be substantially similar to the semiconductor device 110 in structure and function and includes a stack (e.g., the stack 108) having a plurality of insulating layers 312 and gate layers 324, channel layers 316, memory layers 314, an etch stop layer 372, a dielectric layer 307, a source (not shown), a drain 322, and a via 380. A global drain line 370 is coupled to the via 380. The insulating layers 312, the gate layers 324, the channel layers 316, the memory layers 314, the etch stop layer 372, the dielectric layer 307, the global drain line 370, the source and the drain 322 may be substantially similar to the insulating layers 112, the gate layers 124, the channel layers 116, the memory layers 114, the etch stop layer 172, the dielectric layer 107, the global drain lines 170, the source 120 and the drain 122, respectively.

The via 380 includes a via base 382 extending in a plane defined by the first direction and a second direction perpendicular to the first direction (e.g., the X-Y plane), the via base 382 structured to contact the corresponding global drain line 370. Via sidewalls 384 extend from outer peripheral edges of the via base 382. Different from the via 180, and 280, the via sidewalls 384 include a via sidewall first portion 385 extending from the outer peripheral edge of the via base 382 at an angle of greater than 90 degrees (e.g., in a range of 100 degree to 160 degrees, inclusive), with respect to the via base 382. A via sidewall second portion 386 extends vertically in the Z-direction from an axial end of the via sidewall first portion 385 away from the via base 382, for example, at an angle β of about 90 degrees (e.g., in a range of 85 degrees to 95 degrees, inclusive), with respect to the via base 382, i.e., axially upwards in the Z-direction, such that the via 380 defines an internal cavity within which at least a portion of an axial end 323 of the drain 322 in the Z-direction is disposed.

A via first width W1a of the via 380 defined by a width of the via base 382 may be about equal to or larger than a drain width W2 of the drain in the X-plane or the Y-plane. A via second width W1b defined by a distance between axial ends of opposing via sidewall second portions 386 in the first direction (e.g., the X-direction) or the second direction (e.g., the Y-direction) is larger than the drain width W2 of the drain 322 in the first direction or the second direction.

The via sidewall first portion 385 and second portion 386 may facilitate contact of the drain 322 with an inner surface of the via sidewalls 384, and provide a larger contact area relative to the via 180, when misalignment occurs. In some embodiments, a first ratio between the via first width W1a and the drain width W2 (W1a:W2) may be in a range of 1:1 to 1.2:1, inclusive. In some embodiments, a second ratio between the via second width W1b and the drain width W2 (W1b:W2) is in a range of 1.1:1 to 2:1, inclusive (e.g., 1.1:1, 1.2:1, 1.4:1, 1.6:1, 1.8:1, or 2:1, inclusive). These ranges and values are just examples, and other ranges and values are contemplated and should be considered to be within the scope of this application.

FIG. 12 shows the drain 322 being axially aligned with the via 380 such that a center point of the drain 322 in the X-Y plane is axially aligned with a corresponding center point of the via base 382 in the X-Y plane. In such embodiments, radially outer surfaces of the drain 322 are disposed radially inwards of the via sidewall first and second portions 385 and 386 such that the axial end 323 of the drain 322 is located within the internal cavity defined by the via 380 and an axial end surface of the axial end 323 is in contact with a surface of the via base 382 such that a contact area is formed between the drain 322 and the via 380. The remaining portion of the internal cavity of the via 380 is filled with an insulating material 374.

In other embodiments, the drain 322 may be misaligned or axially offset form the via 380 (or any other via described herein). For example, FIG. 13 shows a side cross-section view of a portion of the semiconductor device 310a, according to an embodiment. The semiconductor device 310a includes the stack including the plurality of insulating layers 312 and gate layers 324, channel layers 316, memory layers 314, a source (not shown), and a drain 322a, the etch stop layer 372, the dielectric layer 307, and a via 380a. The global drain line 370 is coupled to the via 380a. The via 380a includes a via base 382a and via sidewalls 384a including a via sidewall first portion 385a extending from the outer peripheral edge of the via base 382a at an angle of greater than 90 degrees with respect to the via base 382, and a via sidewall second portion 386a extends vertically in the Z-direction from an axial end of the via sidewall first portion 385a away from the via base 382a. The via 380a may be substantially similar to the via 380, previously described herein.

A first axis A1 extending in a vertical direction (e.g., the Z-direction) through a central point of the drain 322a in the X-Y plane, is axially offset from a second axis A2 extending in the vertical direction (e.g., the Z-direction) through a central point of the via base 382a by a first distance D1. This causes a portion of an outer radial surface of an axial end 323a of the drain 322a to contact an inner surface of the via sidewall first portion 385a in the X-Y-Z plane, and an inner surface of the via sidewall second portion 386a in the Y-Z or X-Z plane. The remaining portion of an internal cavity of the via 380a is filled with an insulating material 374a. A contact area between an axial end surface of the drain 322a and the via 380a is equal to or less than the contact area between the drain 322 and via 380 of the semiconductor device 310.

Figures 14, 15:
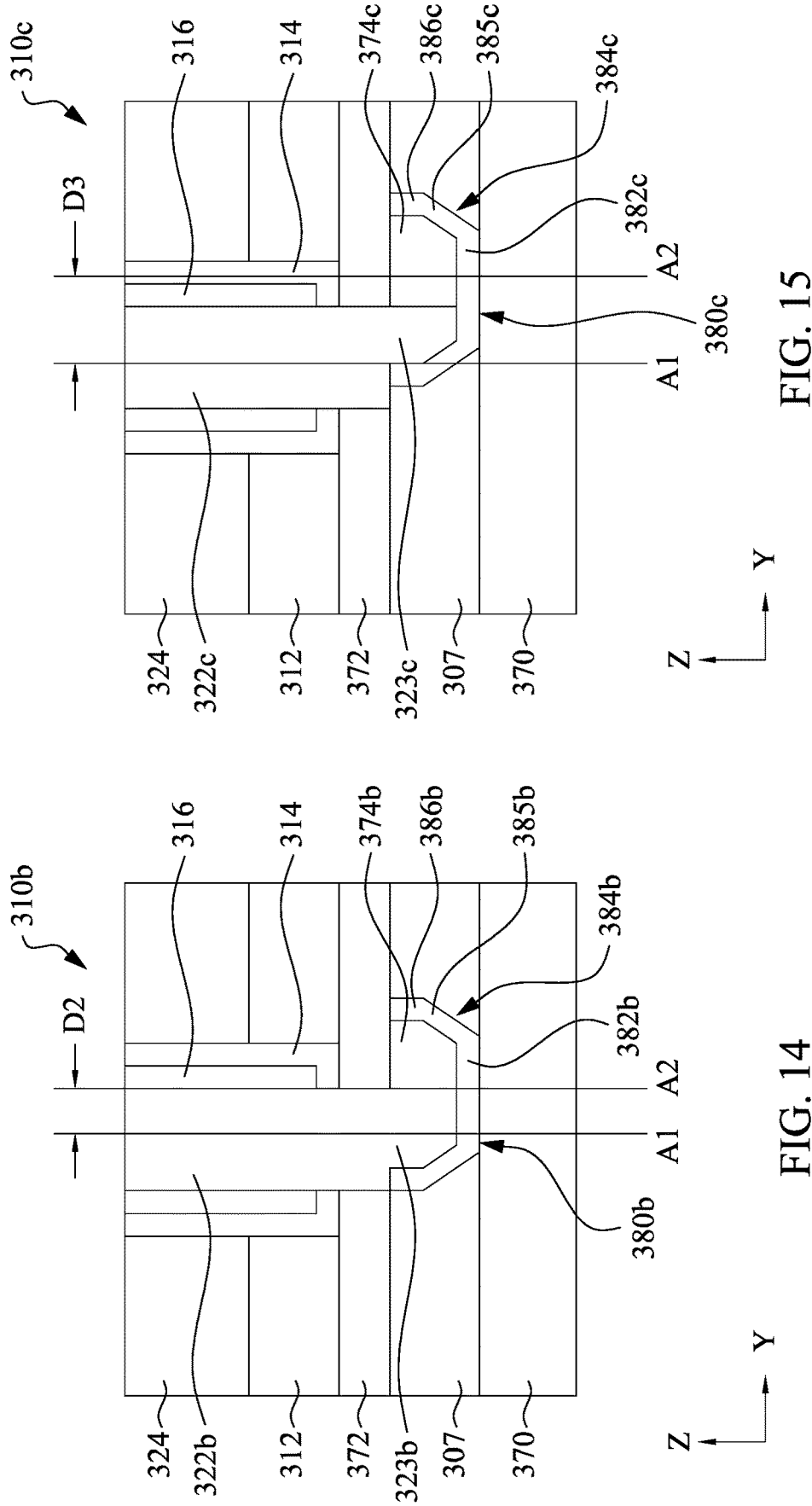

FIG. 14 shows a side cross-section view of a portion of the semiconductor device 310b, according to another embodiment. The semiconductor device 310b includes the stack including the plurality of insulating layers 312 and gate layers 324, channel layer 316, memory layers 314, a source (not shown), and a drain 322b, the etch stop layer 372, the dielectric layer 307, and a via 380b. The global drain line 370 is coupled to the via 380b. The via 380b includes a via base 382b and via sidewalls 384b including a via sidewall first portion 385b extending from the outer peripheral edge of the via base 382b at an angle of greater than 90 degrees with respect to the via base 382b, and a via sidewall second portion 386b extending vertically in the Z-direction from an axial end of the via sidewall first portion 385b away from the via base 382b. The via 380b may be substantially similar to the via 380, previously described herein.

A first axis A1 extending in a vertical direction (e.g., the Z-direction) through a central point of the drain 322b in the X-Y plane, is axially offset from a second axis A2 extending in the vertical direction (e.g., the Z-direction) through a central point of the via base 382b by a second distance D2 that is larger than the first distance D1 of the semiconductor device 310a. This causes a portion of an outer radial surface of an axial end 323b of the drain 322b to contact an inner surfaces of the via sidewall first portion 385b in the X-Y-Z plane, an inner surface of the via sidewall second portion 386b, as well as portion of an axial end surface of the drain 322b to contact an axial end of the corresponding via sidewall second portion 386b. A contact area between an axial end surface of the drain 322b and the via 380b is equal to or less than the contact area between the drain 322/322a and via 380/380a of the semiconductor device 310/310a.

A radial outer extent of the drain 322b is axially aligned with or radially inwards of an axially outwards extent of the via 380b (i.e., a radially outer surface of the via sidewall second portion 386b). In other embodiments, a drain may be misaligned such that a radial outer extent of the drain extends beyond a radial outer extent of the via. For example, FIG. 15 shows a side cross-section view of a portion of the semiconductor device 310c, according to another embodiment. The semiconductor device 310c includes the stack including the plurality of insulating layers 312 and gate layers 324, channel layer 316, memory layers 314, a source (not shown), and a drain 322c, the etch stop layer 372, the dielectric layer 307, and a via 380c. The global drain line 370 is coupled to the via 380c. The via 380c includes a via base 382c and via sidewalls 384c including a via sidewall first portion 385c extending from the outer peripheral edge of the via base 382c at an angle of greater than 90 degrees with respect to the via base 382c, and a via sidewall second portion 386c extends vertically in the Z-direction from an axial end of the via sidewall first portion 385c away from the via base 382c. The via 380c may be substantially similar to the via 380, previously described herein.

A first axis A1 extending in a vertical direction (e.g., the Z-direction) through a central point of the drain 322c in the X-Y plane, is axially offset from a second axis A2 extending in the vertical direction (e.g., the Z-direction) through a central point of the via base 382c by a third distance D3 that is larger than the second distance D2 of the semiconductor device 310b. This causes a portion of an outer radial surface of an axial end 323c of the drain 322c to contact an inner surface of the via sidewall first portion 385c and the via sidewall second portion 386c, a portion of an axial end surface of the axial end 323c of the drain 322c to contact an axial end of the corresponding via sidewall second portion 386c, and another portion of the axial end surface of the axial end 323c to extend radially outward of the via 380c and contact the dielectric layer 307. The remaining portion of an internal cavity of the via 380c is filled with an insulating material 374c. A contact area between an axial end surface of the drain 322c and the via 380c is less than the contact area between the drain 322/322a/322b and the via 380/380a/380b of the semiconductor device 310/310a/310b.

FIG. 16 is a side cross-section view of a portion of a semiconductor device 410, according to yet another embodiment. The semiconductor device 410 may be substantially similar to the semiconductor device 110 in structure and function and includes a stack (e.g., the stack 108) having a plurality of insulating layers 412 and gate layers 424, channel layers 416, memory layers 414, an etch stop layer 472, a dielectric layer 407, a source (not shown), a drain 422, and a via 480. A global drain line 470 is coupled to the via 480. The insulating layers 412, the gate layers 424, the channel layers 416, the memory layers 414, the etch stop layer 472, the dielectric layer 407, the global drain line 470, the source and the drain 422 may be substantially similar to the insulating layers 112, the gate layers 124, the channel layers 116, the memory layers 114, the etch stop layer 172, the dielectric layer 107, the global drain lines 170, the source 120 and the drain 122, respectively.

The via 480 includes a via base 482 extending in a plane defined by the first direction and a second direction perpendicular to the first direction (e.g., the X-Y plane), the via base 482 structured to contact the corresponding global drain line 470. Via sidewalls 484 extend from outer peripheral edges of the via base 482. Different from the via 180, 280, and 380 the via sidewalls 484 include a via sidewall first portion 485 extending from the outer peripheral edge of the via base 482 at an angle of about 90 degrees (e.g., in a range of 85 degree to 95 degrees, inclusive), with respect to the via base 482. A via sidewall second portion 486 extends from an axial end of the via sidewall first portion 485 away from the via base 482 at an angle β of greater than 90 degrees (e.g., in a range of 95 degrees to 160 degrees, inclusive), with respect to the via base 482, such that the via 480 defines an internal cavity within which at least a portion of an axial end 423 of the drain 422 in the Z-direction is disposed.

A via first width W1a of the via 480 defined by a width of the via base 482 may be larger than or about equal to a drain width W2 of the drain in the X-plane or the Y-plane. A via second width W1b defined by a distance between axial ends of opposing via sidewall second portions 486 in the first direction (e.g., the X-direction) or the second direction (e.g., the Y-direction) is larger than the drain width W2 of the drain 422 in the first direction or the second direction.

The via sidewall first portion 485 and second portion 486 may facilitate contact of the drain 422 with an inner surface of the via sidewalls 484, and provide a larger contact area relative to the via 180, when misalignment occurs. In some embodiments, a first ratio between the via first width W1a and the drain width W2 (W1a:W2) may be in a range of 1:1 to 1.6:1, inclusive. In some embodiments, a second ratio between the via second width W1b and the drain width W2 (W1b:W2) is in a range of 1.1:1 to 2:1, inclusive (e.g., 1.1:1, 1.2:1, 1.4:1, 1.6:1, 1.8:1, or 2:1, inclusive). These ranges and values are just examples, and other ranges and values are contemplated and should be considered to be within the scope of this application.

FIG. 16 shows the drain 422 being axially aligned with the via 480 such that a center point of the drain 422 in the X-Y plane is axially aligned with a corresponding center point of the via base 482 in the X-Y plane. In such embodiments, radially outer surfaces of the drain 422 are disposed radially inwards of the via sidewall first and second portions 485 and 486 such that the axial end 423 of the drain 422 is located within the internal cavity defined by the via 480 and an axial end surface of the axial end 423 is in contact with a surface of the via base 482 such that a contact area is formed between the axial end surface of the drain 422 and the via 480. The remaining portion of the internal cavity is filled with an insulating material 474.

In other embodiments, the drain 422 may be misaligned or axially offset form the via 480 (or any other via described herein). For example, FIG. 17 shows a side cross-section view of a portion of the semiconductor device 410a, according to an embodiment. The semiconductor device 410a includes the stack including the plurality of insulating layers 412 and gate layers 424, channel layers 416, memory layers 414, a source (not shown), and a drain 422a, the etch stop layer 472, the dielectric layer 407, and a via 480a. The global drain line 470 is coupled to the via 480a. The via 480a includes a via base 482a and via sidewalls 484a including a via sidewall first portion 485a extending from the outer peripheral edge of the via base 482a at an angle of about 90 degrees with respect to the via base 482, and a via sidewall second portion 486a extends from an axial end of the via sidewall first portion 485a away from the via base 482a at an angle of greater than 90 degrees. The via 480a may be substantially similar to the via 480, previously described herein.

A first axis A1 extending in a vertical direction (e.g., the Z-direction) through a central point of the drain 422a in the X-Y plane, is axially offset from a second axis A2 extending in the vertical direction (e.g., the Z-direction) through a central point of the via base 482a by a first distance D1. This causes a portion of an outer radial surface of an axial end 423a of the drain 422a to contact an inner surface of the via sidewall first portion 485a, and an inner surface of the via sidewall second portion 486a in the X-Y-Z plane. The remaining portion of an internal cavity of the via 480a is filled with an insulating material 474a. A contact area between an axial end surface of the drain 422a and the via 480a is equal to or less than the contact area between the drain 422 and via 480 of the semiconductor device 410.

FIG. 18 shows a side cross-section view of a portion of the semiconductor device 410b, according to another embodiment. The semiconductor device 410b includes the stack including the plurality of insulating layers 412 and gate layers 424, channel layer 416, memory layers 414, a source (not shown), and a drain 422b, the etch stop layer 472, the dielectric layer 407, and a via 480b. The global drain line 470 is coupled to the via 480b. The via 480b includes a via base 482b and via sidewalls 484b including a via first portion 485b extending from the outer peripheral edge of the via base 482b at an angle of about 90 degrees with respect to the via base 482b, and a via sidewall second portion 486b extending from an axial end of the via sidewall first portion 485b at an angle of greater than 90 degrees away from the via base 482b. The via 480b may be substantially similar to the via 480, previously described herein.

A first axis A1 extending in a vertical direction (e.g., the Z-direction) through a central point of the drain 422b in the X-Y plane, is axially offset from a second axis A2 extending in the vertical direction (e.g., the Z-direction) through a central point of the via base 482b by a second distance D2 that is larger than the first distance D1 of the semiconductor device 410a. This causes a portion of an outer radial surface of an axial end 423b of the drain 422b to contact an inner surfaces of the via sidewall first portion 485b, an inner surface of the via sidewall second portion 486b, as well as portion of an axial end surface of the drain 422b to contact an axial end of the corresponding via sidewall second portion 486b. A contact area between an axial end surface of the drain 422b and the via 480b is equal to or less than the contact area between the drain 422/422a and via 480/480a of the semiconductor device 410/410a.

A radial outer extent of the drain 422b is axially aligned with or radially inwards of an axially outwards extent of the via 480b (i.e., a radially outer surface of the via sidewall second portion 486b). In other embodiments, a drain may be misaligned such that a radial outer extent of the drain extends beyond a radial outer extent of the via. For example, FIG. 19 shows a side cross-section view of a portion of the semiconductor device 410c, according to another embodiment. The semiconductor device 410c includes the stack including the plurality of insulating layers 412 and gate layers 424, channel layer 416, memory layers 414, a source (not shown), and a drain 422c, the etch stop layer 472, the dielectric layer 407, and a via 480c. The global drain line 470 is coupled to the via 480c. The via 480c includes a via base 482c and via sidewalls 484c including a via sidewall first portion 485c extending from the outer peripheral edge of the via base 482c at an angle of about 90 degrees with respect to the via base 482c, and a via sidewall second portion 486c extends from an axial end of the via sidewall first portion 485c at an angle of greater than 90 degrees away from the via base 482c. The via 480c may be substantially similar to the via 480, previously described herein.

A first axis A1 extending in a vertical direction (e.g., the Z-direction) through a central point of the drain 422c in the X-Y plane, is axially offset from a second axis A2 extending in the vertical direction (e.g., the Z-direction) through a central point of the via base 482c by a third distance D3 that is larger than the second distance D2 of the semiconductor device 410b. This causes a portion of an outer radial surface of an axial end 423c of the drain 422c to contact an inner surface of the via sidewall first portion 485c and the via sidewall second portion 486c, a portion of an axial end surface of the axial end 423c of the drain 422c to contact an axial end of the corresponding via sidewall second portion 486c, and another portion of the axial end surface of the axial end 423c to extend radially outward of the via 480c and contact the dielectric layer 407. The remaining portion of an internal cavity of the via 480c is filled with an insulating material 474c. A contact area between an axial end surface of the drain 422c and the via 480c is less than the contact area between the drain 422/422a/422b and via 480/480a/480b of the semiconductor device 410/410a/410b.

FIG. 20A-20C illustrate a flowchart of a method 500 for forming a semiconductor die 600, for example, a die including a plurality of 3D memory devices (e.g., any of the semiconductor devices described with respect to FIGS. 1-19), according to an embodiment. For example, at least some of the operations (or steps) of the method 500 may be used to form a 3D memory device (e.g., the semiconductor device 110, 110a-c, 210, 210a-c, 310, 310a-c, or 410, 410a-c), a nanosheet transistor, a nanowire transistor deice, a vertical transistor device, or the like. It should be noted that the method 500 is merely an example, and is not intended to limit the present disclosure. Accordingly, it is understood that additional operations may be provided before, during, and after the method 500 of FIGS. 20A-20C, and that some other operations may only be described briefly herein. In some embodiments, operations of the method 500 may be associated with perspective views and associate cross-section views of an example semiconductor die 600 at various fabrication stages as shown in FIGS. 21A, 21B, 22A, 22B, 23A, 23B, 24A, 24B, 25A, 25B, 26A, 26B, 27A, 27B, 28A, 28B, 29A, 29B, 30A, 30B, 31, 32A, 32B, 33A, 33B, 34, 35, 36A, 36B, and 37 in some embodiments are represented with respect to the semiconductor die 600 that represents a 3D memory device, the operations are equally applicable to any other semiconductor device, for example, the semiconductor devices 110, 110a-c, 210, 210a-c, 310, 310a-c, 410, 410a-c shown in FIGS. 1-19 or any other semiconductor die (e.g., a GAA FET device, a nanosheet transistor device, a nanowire transistor device, a vertical transistor device, etc.). Although FIGS. 21A-37 illustrate the semiconductor die 600 including the plurality of semiconductor devices 110, it is understood the semiconductor die 600 may include a number of other devices such as inductors, fuses, capacitors, coils, etc., which are not shown in FIGS. 21A-37, for purposes of clarity of illustration.

The method 500 may generally include forming a plurality of global drain lines. A dielectric layer is deposited on the global drain lines. A plurality of vias are formed through the dielectric layer such that a portion of each of the plurality of vias contacts a corresponding global drain line of the plurality of global drain lines, each of the plurality of vias having a cup shape and defining an internal cavity. The method 500 also includes depositing an etch stop layer over the dielectric layer opposite the plurality of global drain lines. A stack comprising a plurality of insulating layer and a plurality of sacrificial layers alternatively stacked on top of each other on the etch stop layer is formed. The plurality of sacrificial layers are replaced with a plurality of gate layers. A plurality of memory layers extending in a first direction are formed. A plurality of channel layers extending in the first direction are formed. The method 500 also includes forming sources and drains spaced apart from a corresponding source in the first direction such that the channel layer is disposed on radially outer surface of the source and the drain in the first direction. An axial end of the drain extends through the stack to a corresponding via and contacts the corresponding via such that at least a portion of the axial end of each drain is disposed in the internal cavity defined by the corresponding via. In some embodiments, the method 500 also includes filling internal cavities of each of the plurality of vias with an insulating material prior to depositing the etch stop layer such that the axial end of the each of the drains extends through the insulating material to contact at least a portion of the via.

Expanding further, the method 500 starts with operation 502 that includes forming a plurality of global drain lines. Corresponding to operation 502, FIG. 21A is a top, perspective view of a semiconductor die 600, and FIG. 21A is a side cross-section view of a global drain line 170 included in the semiconductor die 600 taken along the line A-A in FIG. 21A. The global drain lines 170 are spaced apart from each other in a first direction (e.g., the X-direction), and extend in a second direction (e.g., the Y-direction) perpendicular to the first direction. The spacing between the global drain lines 170 may correspond to a pitch of the drains of adjacent semiconductor devices 110 in each row of semiconductor devices 110 that will be later formed in the semiconductor die 100. In some embodiments, the global drain lines may be formed using physical vapor deposition (PVD), chemical vapor deposition (CVD), low pressure chemical vapor deposition (LPCVD), plasma enhanced CVD (PECVD), atomic layer deposition (ALD), molecular beam epitaxy (MBE), a high aspect ratio process (HARP), any other suitable process or a combination thereof. In particular embodiments, the global drain lines may be formed by forming a layer including the global drain line material, and then etching portions of the layer to form the global drain lines. While not shown, the global drain lines 170 may be formed on a substrate that may be later removed, or remain included in the semiconductor die 600. The global drain lines 170 may be formed from conductive materials such as metals (e.g., copper, aluminum, gold, platinum, silver, chromium, titanium), any suitable conductive material or combination thereof.

Figure 22B:
Figure 22A:
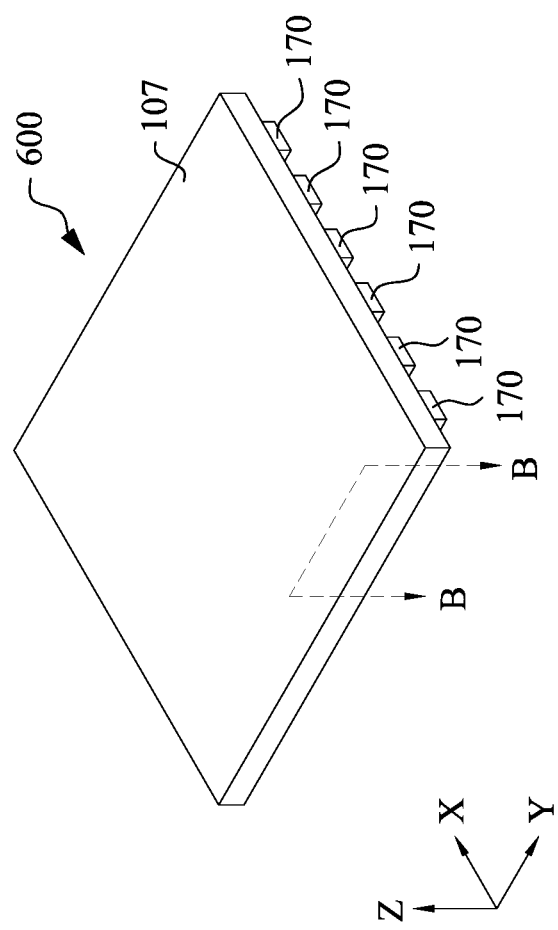

At operation 504, a dielectric layer is deposited over the global drain lines. Corresponding to operation 504, FIG. 22A is a top perspective view of the semiconductor die, and FIG. 22B is a side cross-section view of the semiconductor die 600 taken along the line B-B shown in FIG. 22A, after forming the dielectric layer 107. In some embodiments, the dielectric layer 107 may be formed using PVD, CVD, LPCVD, PECVD, ALD, MBE, HARP, any other suitable process or a combination thereof. In other embodiments, the dielectric layer 107 may be provided first and the global drain lines 170 may be formed on a back side or bottom side of the dielectric layer 107. The dielectric layer may include an IMD, for example, a fluorine doped $SiO_2$, organosilicate glass (OSG), porous $SiO_2$, carbon-doped dioxide, spin-on organic polymer dielectrics, spin-silicon based polymeric dielectrics, any other suitable IMD, or a combination thereof.

Figure 23B:
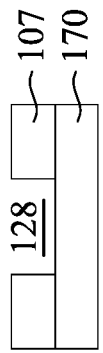
Figure 23A:
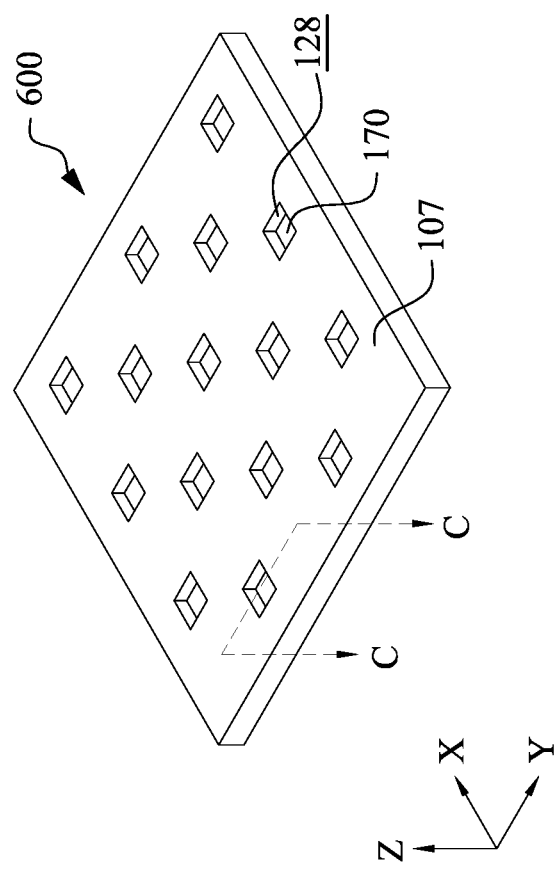

At operation 506, a plurality of via holes are formed through the dielectric layer. Corresponding to operation 506, FIG. 23A is a top, perspective view of the semiconductor die 600, and FIG. 23B is a side cross-section view of the semiconductor die 600 taken along the line C-C shown in FIG. 23A, after forming a plurality of via holes 128 through the dielectric layer 107. The via holes 128 may be formed at locations where corresponding drains 122 of the semiconductor device 110 are intended to be located. The via holes 128 may be formed by etching the dielectric layer 107 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the via holes 128. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated. As shown in FIG. 23A-23B, the etch used to form the array of via holes 128 etches through each of the dielectric layer 107 but does not etch, or minimally etches the global drain line 170, i.e., the etch has a high etch selectivity ratio for the dielectric layer 107 over the global drain lines 170.

Figure 24B:
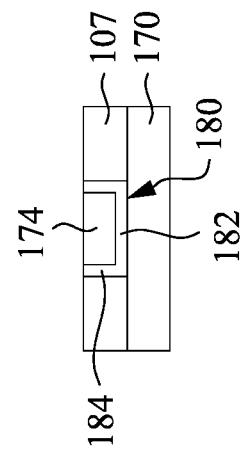
Figure 24A:
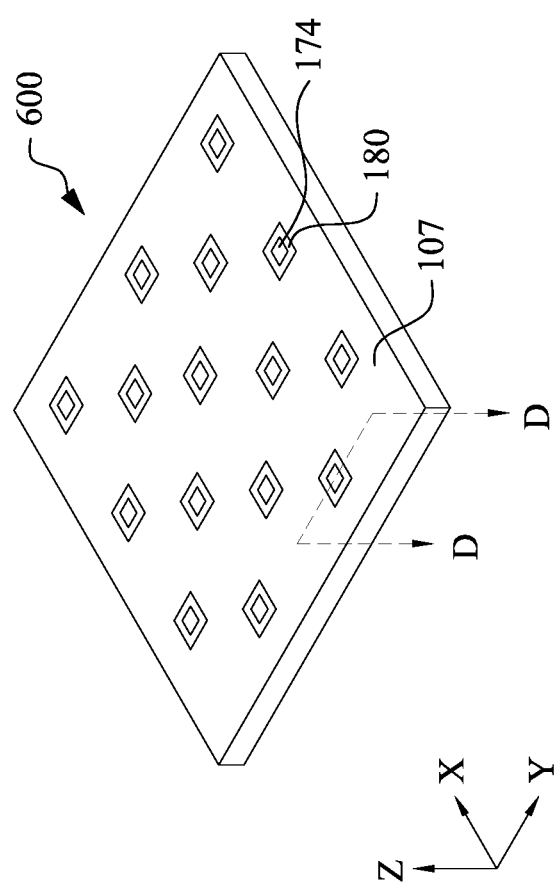

At operation 508, a via is formed in each of the via holes. At 510, an internal cavity of the vias is filled with an insulating material. Corresponding to operations 508-510, FIG. 24A is a top, perspective view of the semiconductor die 600, and FIG. 24B is a side cross-section view of the semiconductor die 600 taken along the line D-D shown in FIG. 24A, after forming the vias 180 and filling the internal cavity of the vias with the insulating material 174. The vias 180 may be formed using PVD, CVD, LPCVD, PECVD, ALD, MBE, HARP, any other suitable process or a combination thereof. The deposition process deposits the via material on the base of the via holes 128, i.e., on the global drain lines 170 to form the via base 182 that electrically contacts the corresponding global drain line 170, and on sidewalls of the via holes 128, which are defined by the dielectric layer 107 to form via sidewalls 184 of the via 180. The via 180 may include a conductive material, for example, metals such as copper, chromium, nickel, titanium, silver, gold, platinum, any other suitable conductive material or a combination thereof. While FIG. 24B and following figures corresponding to the method 400 depict the semiconductor die 600 as including the via 180, it should be understood that semiconductor die 180 can include any of the other vias described herein (e.g., the via 180a/b/c, 280, 280a/b/c, 380, 380a/b/c, or 480, 480a/b/c, other any other via described herein.

The internal cavity defined by the via base 182 and via sidewalls 184 is filled with an insulating material 174, for example, using PVD, CVD, LPCVD, PECVD, ALD, MBE, HARP, any other suitable process or a combination thereof. The insulating material 174 may include, for example, SiN, SiO, $SiO_2$, SiCN, SiOCN, SiON, HfO2, $TaO_X$, $TiO_X$, $AlO_X$, any other suitable material or combination thereof). In some embodiments, a chemical-mechanical polishing (CMP) operation may be performed after depositing the insulating material 174 to planarize the top surface of the semiconductor die 600, and remove extra via material and/or insulation material that may be disposed over the dielectric layer 107.

Figure 25B:
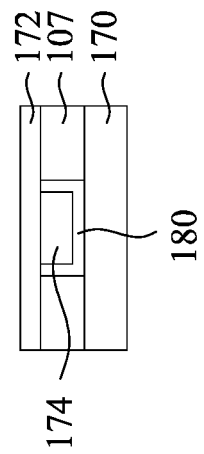
Figure 25A:
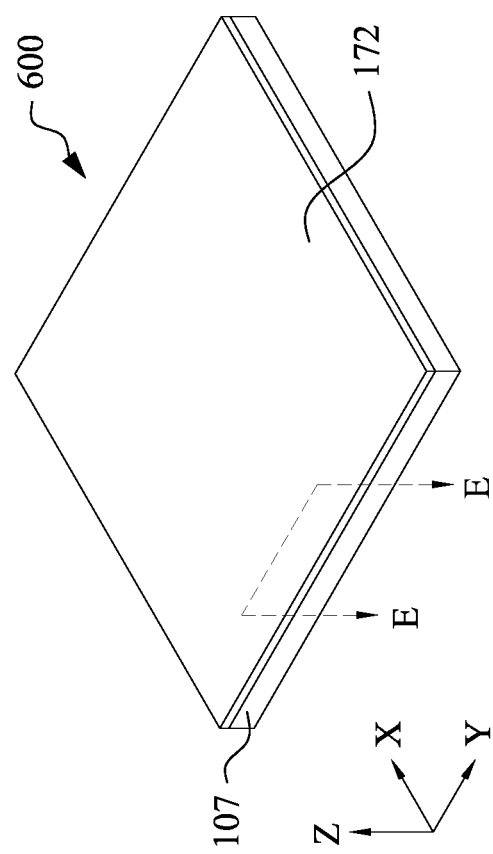

At operation 512, an etch stop layer is deposited over the dielectric layer. Corresponding to operation 512, FIG. 25A is top perspective view of the semiconductor die 600, and FIG. 25B is a side cross-section view of the semiconductor die 600 taken along the line E-E in FIG. 25A, after forming the etch stop layer 172. The etch stop layer 172 may be formed using a plasma deposition process, for example, using PVD, CVD, LPCVD, PECVD, ALD, MBE, HARP, any other suitable process or a combination thereof. In various embodiments, the etch stop layer 172 may include SiN, SiO, Sift, SiCN, SiOCN, SiON, HfO2, $TaO_X$, $TiO_X$, $AlO_X$, a metal carbide, any other suitable material or combination thereof, and may include a single layer or various sublayers.

Figure 26B:
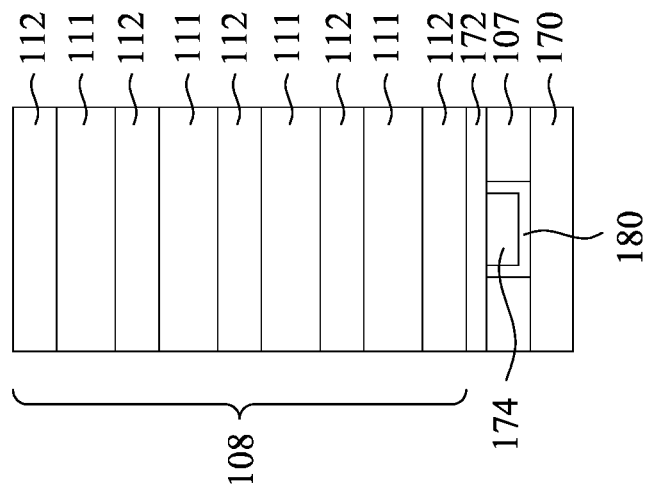
Figure 26A:
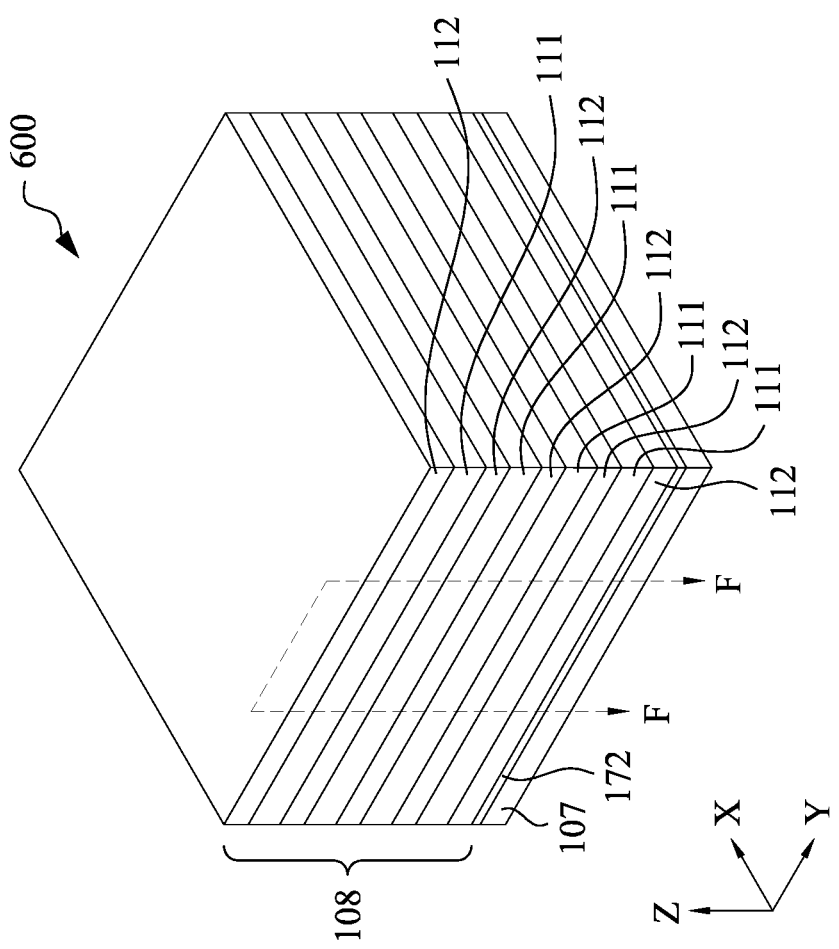

At operation 514, a stack (e.g., the stack 108 shown in FIGS. 1A-1B, and 3-4) is formed on the dielectric layer 107. The stack includes a plurality of insulating layers (e.g., the insulating layers 112) and a plurality of sacrificial layers (e.g., the sacrificial layers 111 shown in FIGS. 1A-1B and 3-4) alternately stacked on top of each other in the vertical direction (e.g., the Z-direction). Corresponding to operations 512, FIG. 26A is a top, perspective view of the semiconductor die 600, and FIG. 26B is a cross-section view of the semiconductor die 600 taken along the line F-F in FIG. 26A, after forming the stack 108. The insulating layers 112 and the sacrificial layers 111 are alternately disposed on top of one another in the Z-direction. For example, one of the sacrificial layers 111 is disposed over one of the insulating layers 112, then another one of the insulating layers 112 is disposed on the sacrificial layer 111, so on and so forth. As shown in FIGS. 26A-26B, a topmost layer (e.g., a layer distal most from the dielectric layer 107) and a bottommost layer (e.g., a layer most proximate to the dielectric layer 107) of the stack 108 may include an insulating layer 112. While FIGS. 26A-26B show the stack 108 as including 5 insulating layers 112 and 4 sacrificial layers, the stack 108 may include any number of insulating layers 112 and sacrificial layers 111 (e.g., 4, 5, 6, 7, 8, 16, 24, 48, 64, 128, or even more). In various embodiments, if the number of sacrificial layers 111 in the stack 108 is n, a number of insulating layers 112 in the stack 108 may be n+1.

In some embodiments, each of the plurality of insulating layers 112 may have about the same thickness, for example, in a range of about 5 nm to about 100 nm, inclusive. Moreover, the sacrificial layers 111 may have the same thickness or different thickness from the insulating layers 112. The thickness of the sacrificial layers 111 may range from a few nanometers to few tens of nanometers (e.g., in a range of 5 nm to 100 nm, inclusive, but other ranges and values are also contemplated and are within the scope of this disclosure). In other embodiments, a topmost sacrificial layer 111 and/or a bottom most sacrificial layer 111 may be thicker (e.g., 1.2×, 1.4×. 1.6×, 1.8×, 2×, 2.5×, or 3× thicker) than the other sacrificial layers 111 disposed therebetween.

The insulating layers 112 and the sacrificial layers 111 have different compositions. In various embodiments, the insulating layers 112 and the sacrificial layers 111 have compositions that provide for different oxidation rates and/or different etch selectivity between the respective layers. In some embodiments, the insulating layers 112 may be formed from SiO, and the sacrificial layers 111 may be formed from SiN. In various embodiments, the insulating layers 112 may be formed from any suitable first material (e.g., an insulating material) as described with respect to the semiconductor device 110, and the sacrificial layers 111 may be formed from a second material (e.g., also an insulating material) that is different from the first material. In some embodiments, the sacrificial layers may 111 include SiN, $HfO_2$, $TaO_x$, $TiO_x$, $AlO_x$, or any other material that has a high etch selectivity relative to the insulating layers 112 (e.g., an etch selectivity ratio of at least 1:100). The sacrificial layers 111 are merely spacer layers that are eventually removed and do not form an active component of the semiconductor die 600.

In various embodiments, the insulating layers 112 and/or the sacrificial layers 111 may be epitaxially grown from the dielectric layer 107. For example, each of the insulating layers 112 and the sacrificial layers 111 may be grown by a MBE process, a CVD process such as a metal organic CVD (MOCVD) process, a furnace CVD process, and/or other suitable epitaxial growth processes. In other embodiments, the insulating layers 112 and the sacrificial layers 111 may be grown using an atomic layer deposition (ALD) process.

Figure 27B:
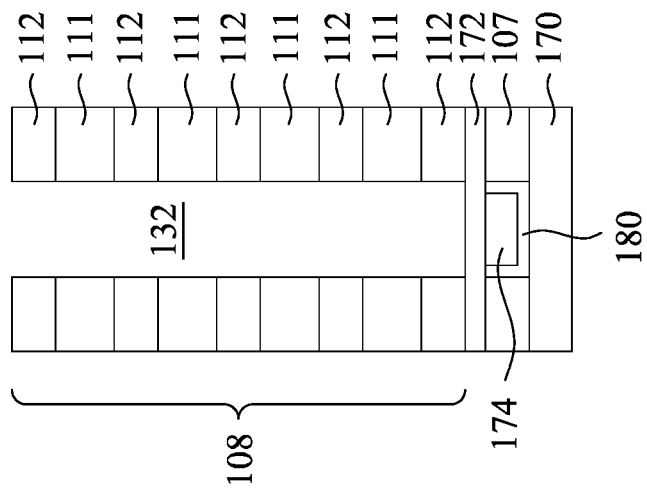
Figure 27A:
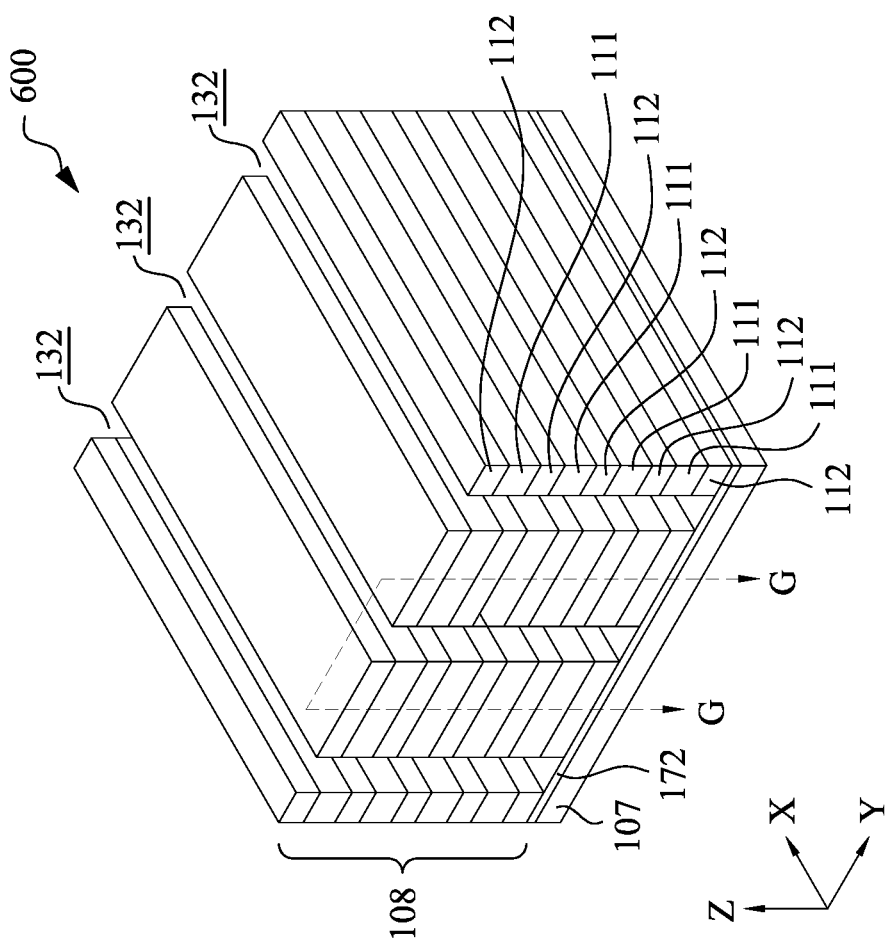

At operation 516, a plurality of first trenches are formed through the stack in the first direction (e.g., the X-direction), the trenches extending from the topmost insulating layer to the etch stop layer. Corresponding to operation 516, FIG. 27A is a top, perspective view of the semiconductor die 600, and FIG. 27B is a side cross-section view of the semiconductor die 600 taken along the line G-G in FIG. 27A, after a plurality of first trenches 132 extending in the X-direction have been formed through the stack 108 up to the etch stop layer 172 by etching the stack 108 in the Z-direction. The etching process for forming the plurality of trenches 132 may include a plasma etching process, which can have a certain amount of anisotropic characteristic. For example, the trenches 132 may be formed, for example, by depositing a photoresist or other masking layer on a top surface of the semiconductor die 600, i.e., the top surface of the topmost insulating layer 112 of the stack 108, and a pattern corresponding to the first trenches 132 defined in the masking layer (e.g., via photolithography, e-beam lithography, or any other suitable lithographic process). In other embodiments, a hard mask may be used.

Subsequently, the stack 108 may be etched using a plasma etching process (including radical plasma etching, remote plasma etching, and other suitable plasma etching processes, ME, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the first trenches 132. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated. As shown in FIGS. 27A-27B, the etch used to form the plurality of first trenches 132 etches through each of the sacrificial layers 111 and insulating layers 112 of the stack 108 such that each of the plurality of first trenches 132 extend form the topmost insulating layer 112 through the bottommost insulating layer 112 to the etch stop layer 172, which prevents over etching.

Figure 28B:
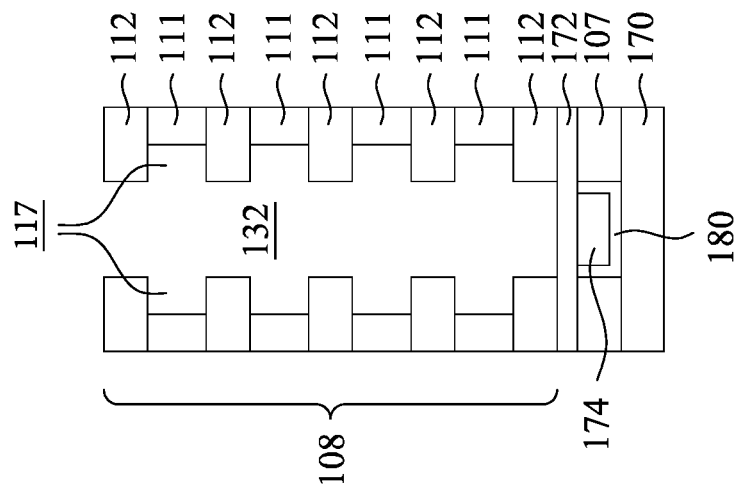
Figure 28A:
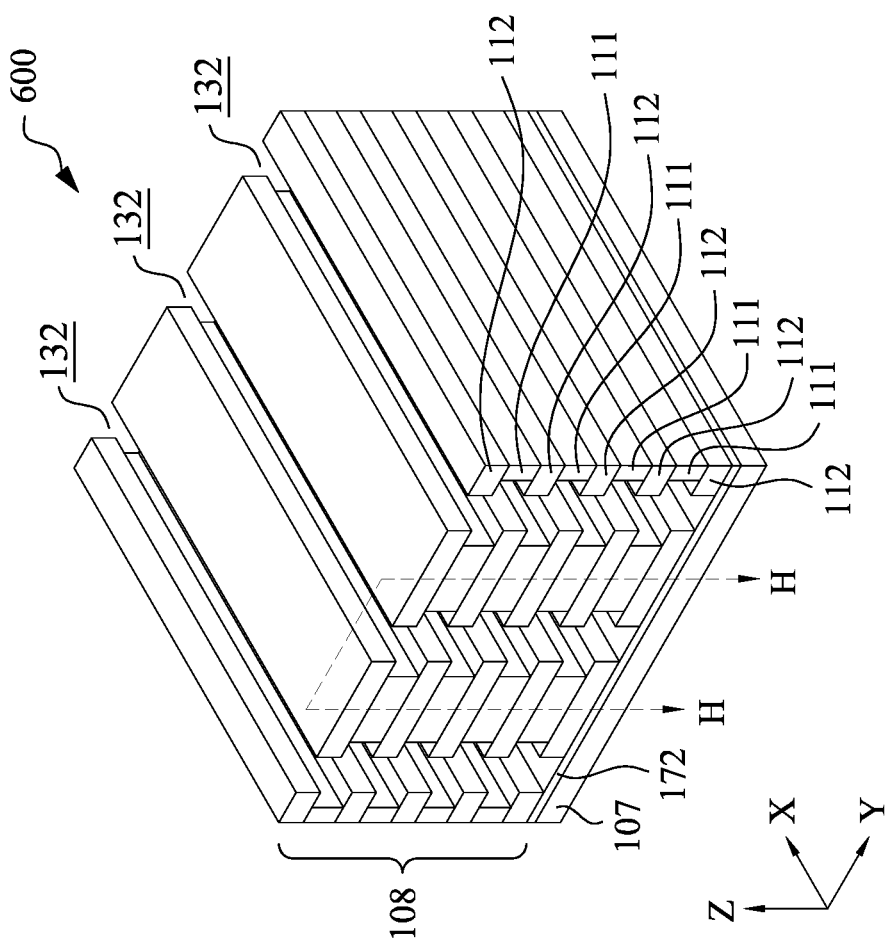

At operation 518, exposed surfaces of the sacrificial layers within the trenches are partially etched so as to reduce a width of the sacrificial layers relative to the insulating layers in the stack. Corresponding to operation 518, FIG. 28A is a top, perspective view of the semiconductor die 600, and FIG. 28B is a side cross-section view of the semiconductor die 600 taken along the line H-H shown in FIG. 28A, after partially etching exposed surfaces of the sacrificial layers 111 that are located in the first trenches 132. For example, the exposed surfaces extend in the X-direction and etching the exposed surfaces of the sacrificial layers 111 reduces a width of the sacrificial layers 111 on either side of the sacrificial layers 111 in the Y-direction. In some embodiments, the sacrificial layers 111 may be etched using a wet etch process (e.g., hydrofluoric etch, buffered hydrofluoric acid, phosphoric acid, etc.). In other embodiments, the exposed surfaces of the sacrificial layers 111 may be partially etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Partially etching the sacrificial layers in the Y-direction reduces a width of the sacrificial layers 111 relative to the insulating layers 112 disposed in the stack 108 such that cavities 117 are formed whose boundaries are formed by top and bottom surfaces of adjacent insulating layers 112 and a surface of the partially etched sacrificial layers 111 that face the first trenches 132 and extend in the X-direction. In some embodiments, an adhesive layer may be formed on exposed portions of sidewalls of the first cavities 117, and the sidewalls of the insulating layer 112 that form a sidewall of the first trenches 132 facilitate adhesion of gate layers to these surfaces. In various embodiments, the adhesive layers may include a material that has good adhesion with each of the insulating layers 112, the sacrificial layers 111, and the gate layers 124, for example, Ti, Cr, TiN, WN, etc. The adhesive layers may be deposited using any suitable method including, for example, molecular beam deposition (MBD), ALD, CVD, PECVD, MOCVD, epitaxial growth, and the like. In some embodiments, the adhesive layer may have a thickness in a range of 0.1 nm to 5 nm, inclusive, or any other suitable thickness. In other embodiments, the adhesion layer is excluded.

Figure 29B:
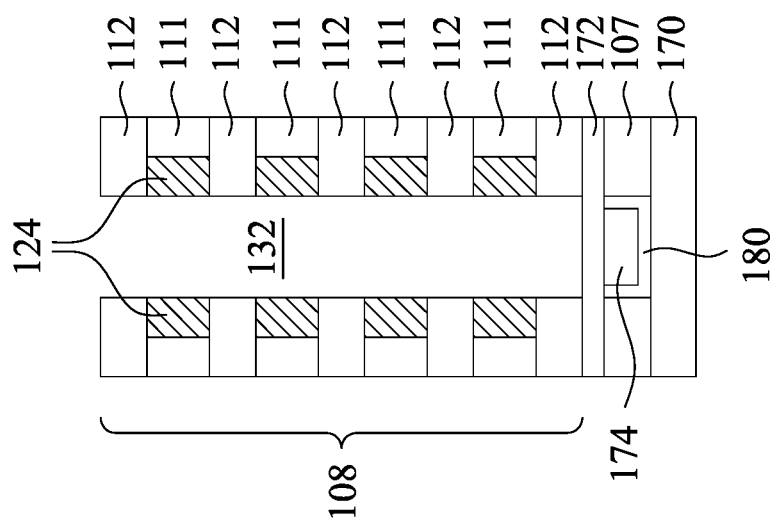
Figure 29A:
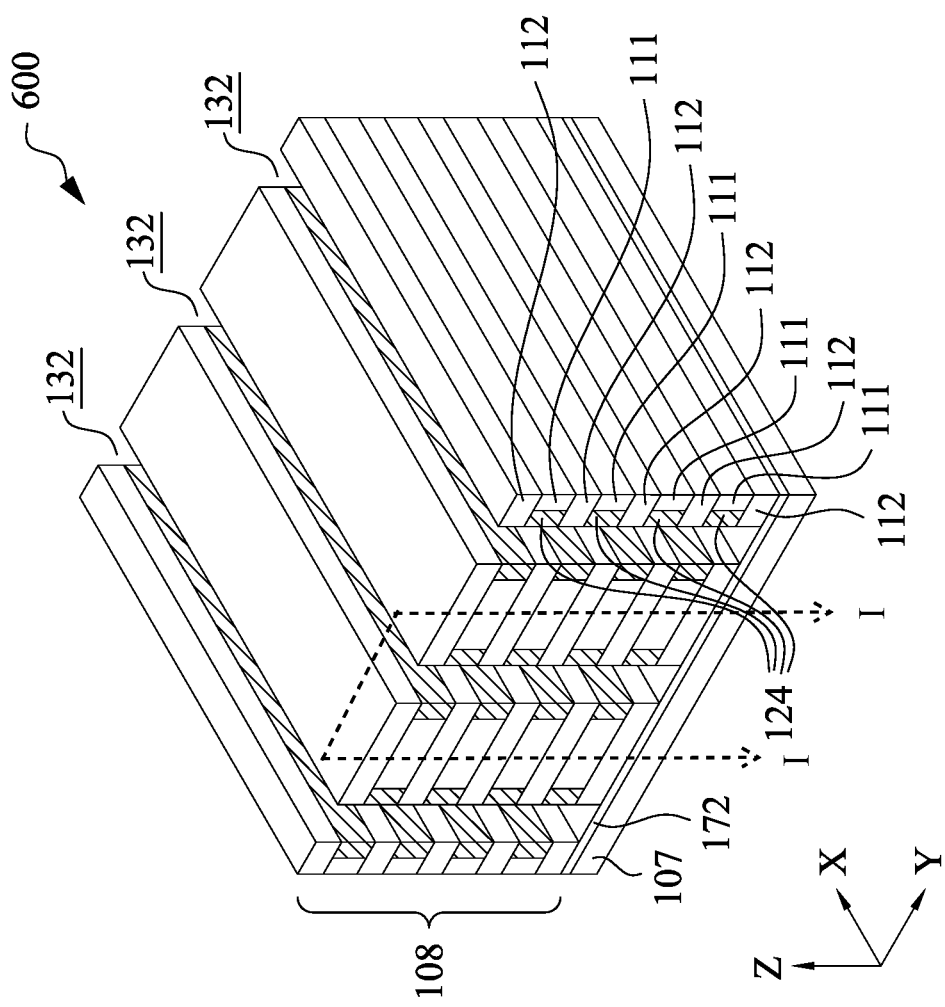

At operation 520, a portion of gate layers is formed in the cavities. Corresponding to operation 520, FIG. 29A is a top, perspective view of the semiconductor die 600, and FIG. 29B is a side cross-section view of the semiconductor die 600 taken along the line I-I in FIG. 29A, after forming the portion of the gate layers 124. In various embodiments, the portion of the gate layers 124 is formed by depositing a gate dielectric and/or gate metal in the cavities 117 (e.g., over the adhesive layer), such that the portion of the gate layers 124 is a continuous along the walls of each of the first trenches 132. In various embodiments, the portion of the gate layers 124 may be formed from a high-k dielectric material. Although, each of the portion of the gate layers 124 shown in FIG. 30A-30B is shown as a single layer, in other embodiments, the portion of the gate layers can be formed as a multi-layer stack (e.g., including a gate dielectric layer and a gate metal layer), while remaining within the scope of the present disclosure. The portion of the gate layers 124 may be formed of different high-k dielectric materials or a similar high-k dielectric material. Example high-k dielectric materials include a metal oxide or a silicate of Hf, Al, Zr, La, Mg, Ba, Ti, Pb, and combinations thereof (e.g., Al, Ti, TiN, TaN, Co, Ag, Au, Cu, Ni, Cr, Hf, Ru, W, Pt, WN, Ru, etc.). The portion of the gate layers 124 can be deposited using any suitable method, including, for example, MBD, ALD, CVD, PECVD, MOCVD, epitaxial growth, and the like.

In some embodiments, the portion of the gate layers 124 may include a stack of multiple metal materials. For example, the gate metal may be a p-type work function layer, an n-type work function layer, multi-layers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, PVD, ALD, and/or other suitable process. In some embodiments, a chemical mechanical planarization (CMP) operation may be performed after filling the first trenches 132 to planarize the top surface of the semiconductor die 600, for example, a top surface of the stack 108.

At operation 522, a memory layer is formed in each of the plurality of first trenches on exposed radial surfaces of the insulating layers and the portion of the gate layers located in the second trenches, such that the memory layer extends in the first direction (e.g., the X-direction), and from the top surface of the semiconductor die to the dielectric layer 107. At operation 524, a channel layer structure is formed within each of the plurality of second trenches on exposed radial surfaces of the memory layer such that the channel layer structure also extends in the first direction. At operation 526, the first trenches are filled with an insulating material to form an isolation layer.

Corresponding to operations 522-526, FIG. 30A is a top, perspective view of the semiconductor die 600, and FIG. 30B is a side cross-section view of the semiconductor device of FIG. 30A taken along the line J-J shown in FIG. 30A, after forming the memory layer 114, the channel layer structure 115, and the isolation layer 140. The memory layer 114 may include a ferroelectric material, for example, lead zirconate titanate (PZT), $PbZr/TiO_3$, $BaTiO_3$, $PbTiO_2$, $HfO_2$, $Hf_{1-x}Zr_xO_2$, $ZrO_2$, $TiO_2$, NiO, $TaO_x$, $Cu_2O$, $Nb_2O_5$, $AlO_x$, etc. The memory layer 114 may be formed using PVD, CVD, LPCVD, PECVD, ALD, MBE, any other suitable process or a combination thereof. A conformal coating may be deposited such that the memory layer 114 is continuous on the walls of the first trenches 132.

The channel layer structure 115 is formed on a radially inner surface of the memory layer 114 in the Y-direction. In some embodiments, the channel layer structure 115 may be formed from a semiconductor material, for example, Si (e.g., polysilicon or amorphous silicon that may be n-type or p-type), Ge, SiGe, silicon carbide (SiC), IGZO, ITO, IZO, ZnO, IWO, etc. The channel layer structure 115 may be formed using PVD, CVD, LPCVD, PECVD, ALD, MBE, any other suitable process or a combination thereof. A conformal coating may be deposited such that the channel layer structure 115 is continuous on the radially inner surface of the memory layer 114.

The insulating material may be deposited in the first trenches 132 to form the isolation layers 140 using any suitable method, for example, MBD, ALD, CVD, PECVD, MOCVD, epitaxial growth, and the like. The isolation layer 140 may include $SiO_2$, SiON, SiN, SiCN, $HfO_2$, $TaO_x$, $TiO_x$, $AlO_x$, etc. In some embodiments, the isolation layer 140 may be formed from the same material of the insulating layers 112. A CMP operation may be performed after filling the second set of first trenches with the insulating material to form the isolation layer 140 to planarize the top surface of the semiconductor die 600.

Figure 31:
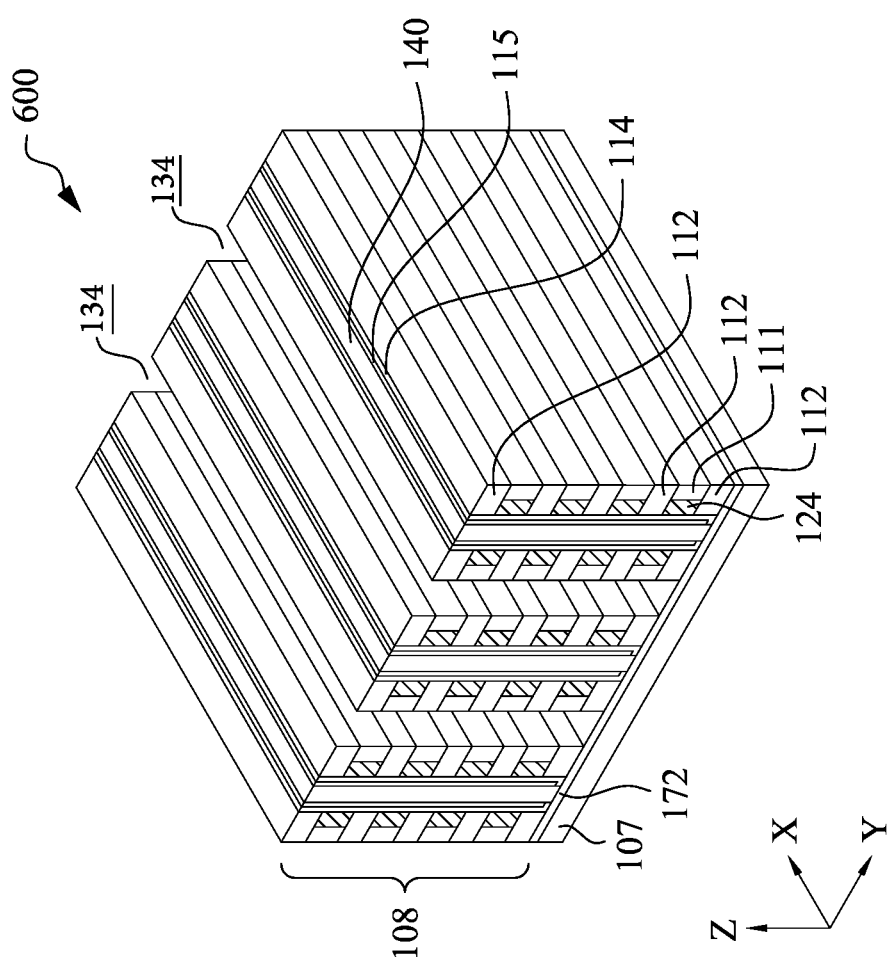

At operation 528, a plurality of second trenches are formed through the stack in the first direction. Corresponding to operation 528, FIG. 31 is a top, perspective view of the semiconductor die 600 after forming the plurality of second trenches 134 extending in the X-direction. The plurality of second trenches 134 may be formed between adjacent isolation layers, and may be formed using the same process used to form the plurality of first trenches 132.

Figure 32B:
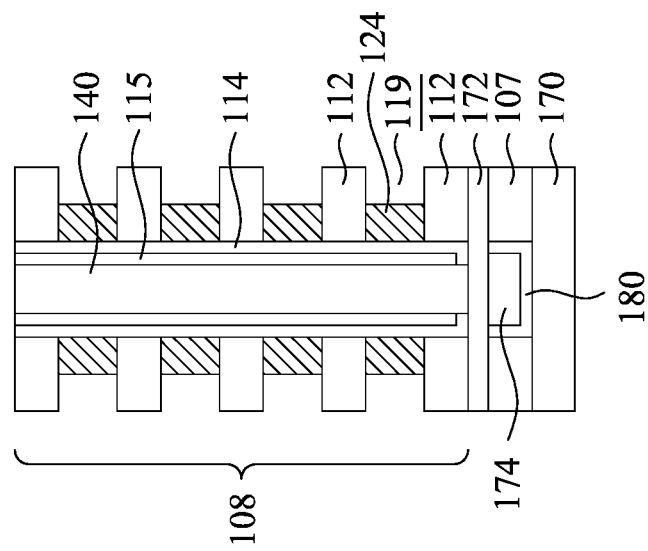
Figure 32A:
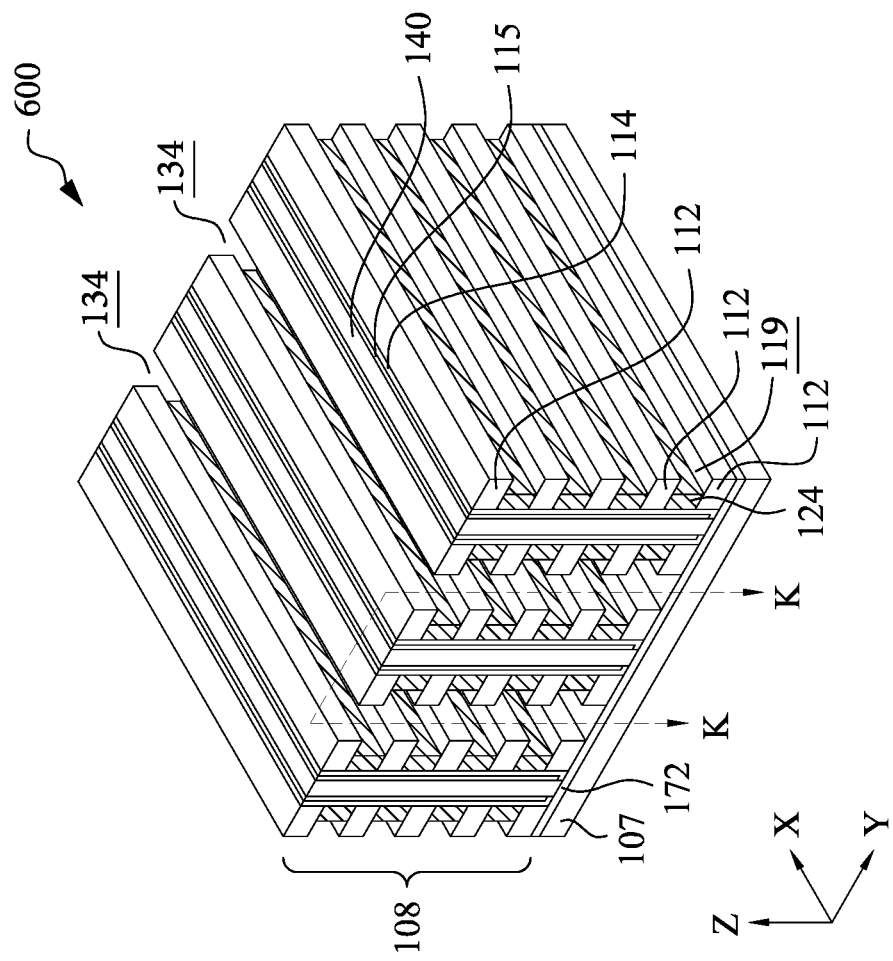

At operation 530, the sacrificial layers 111 are removed. Corresponding to operation 530, FIG. 32A is a top, perspective view of the semiconductor die 600, and FIG. 32B is a side cross-section view of the semiconductor device of FIG. 32A taken along the line K-K shown in FIG. 32A, after forming the memory layer 114, the channel layer structure 115, and the isolation layer 140. The remaining portions of the sacrificial layers 111 may be removed by etching exposed portions of the sacrificial layers 111 in second trenches 134. This leaves second cavities 119 between adjacent layers of insulating layers 112, and adjacent to the previously formed portion of the gate layers 124.

At operation 532, the gate layers are formed. Corresponding to operation 532, FIG. 33A is a top, perspective view of the semiconductor die 600, and FIG. 32B is a side cross-section view of the semiconductor device of FIG. 33A taken along the line L-L shown in FIG. 33A, after forming the gate layers 124. In some embodiments, an adhesive layer may be deposited on walls of the newly formed second cavities 119, as described with respect to operation 518. Next, the gate layer material is deposited in the second cavities 119 so as to form the gate layers 124. In other embodiments, the gate layer material may be directly deposited in the second cavities 119 without using the adhesive layer. A CMP operation may be performed after filling the second set of first trenches with the insulating material to planarize the top surface of the semiconductor die 600.

Figure 34:
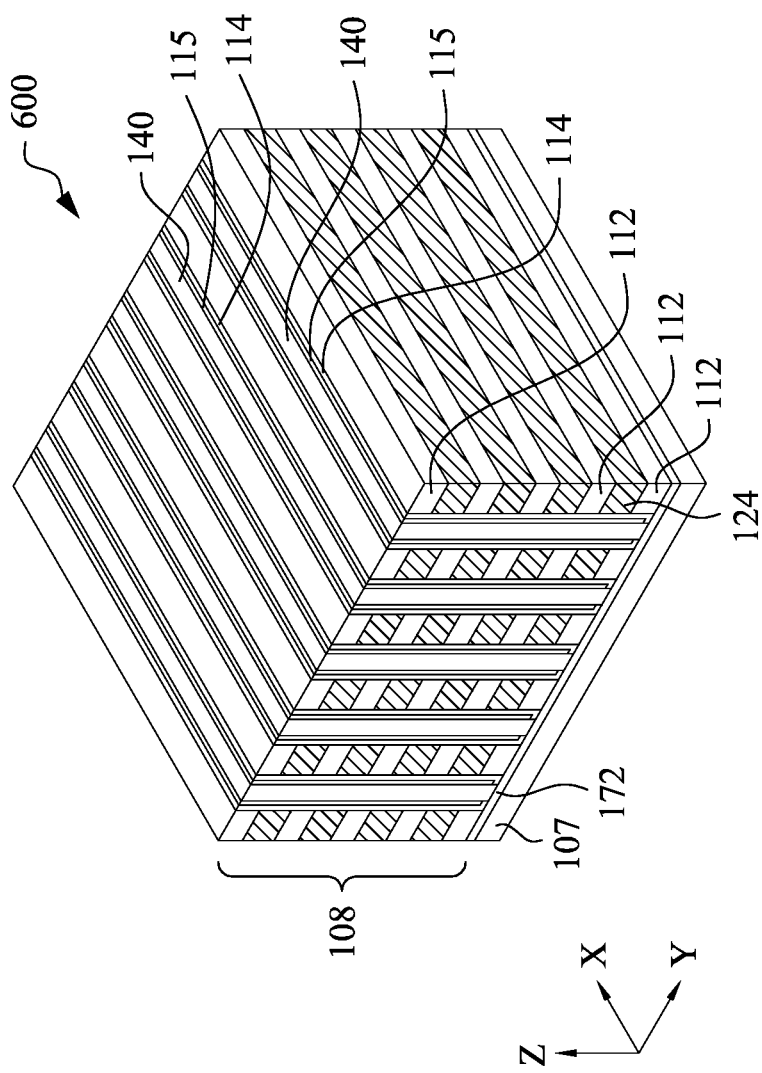

At operation 534, operations 522-526 are repeated so as to form memory layers, channel layer structures, and isolation layers in the second trenches. Corresponding to operation 534, FIG. 34 is a top, perspective view of the semiconductor die 600 after forming the memory layer 114, the channel layer structure 115 and isolation layers in the second trenches 134. A CMP operation may be performed after filling the second trenches 134 with the insulating material to planarize the top surface of the semiconductor die 600.

Figure 35:
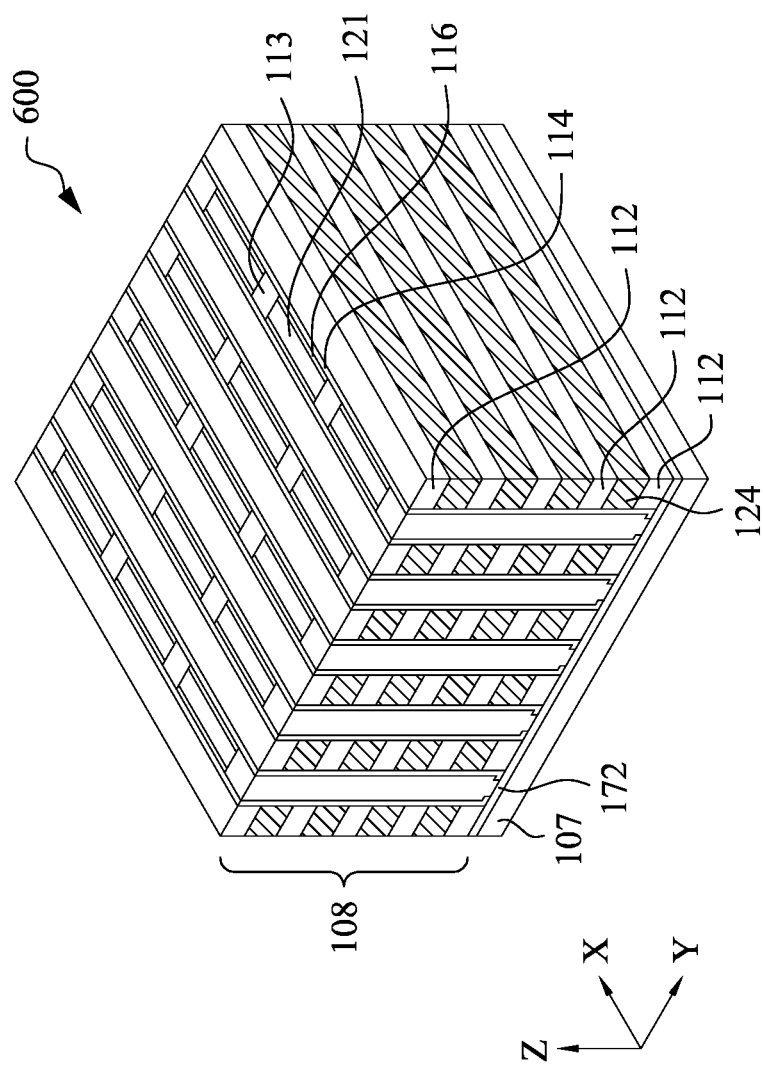

At operation 536, channel layers are formed. At operation 538, device spacers are formed for electrically isolating adjacent devices in a row of semiconductor devices from each other. Corresponding to operation 536-538, FIG. 35 is a top, perspective view of the semiconductor die 600 after forming the channel layers 116 and the device spacers 113. The channel layers 116 may be formed by etching through portions of the isolation layer 140 and adjacent portions of the channel layer structure 115 in the Z-direction up to the etch stop layer 172, such that an array for channel layers 116 are formed in the semiconductor die 600, which are co-extensive with inner spacer structures 121 formed from the isolation layer 140.

The isolation layer 140 and the channel layer structure 115 may be etched simultaneously or sequentially, using a dry etch, for example, a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BC_{13}$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the channel layer 116 and the inner spacer structure 121. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. The cavities formed due to the etching process are then filled with an insulating material (e.g., using MBD, ALD, CVD, PECVD, MOCVD, epitaxial growth, and the like), for example, the same material used to form the isolation layer 140, to form the device spacers 113 with the inner spacer structures 121 disposed between adjacent device spacers 113. Thus, a plurality of rows that include the memory layer 114 and the channel layer 116 are formed in the semiconductor die 600 extending in the X-direction, and having device spacers 113 disposed at regular intervals separating adjacent semiconductor devices 110 that will be form in subsequent steps in the semiconductor die 600. A CMP operation may be performed after forming the device spacers 113 to planarize the top surface of the semiconductor die 600.

Figure 36B:
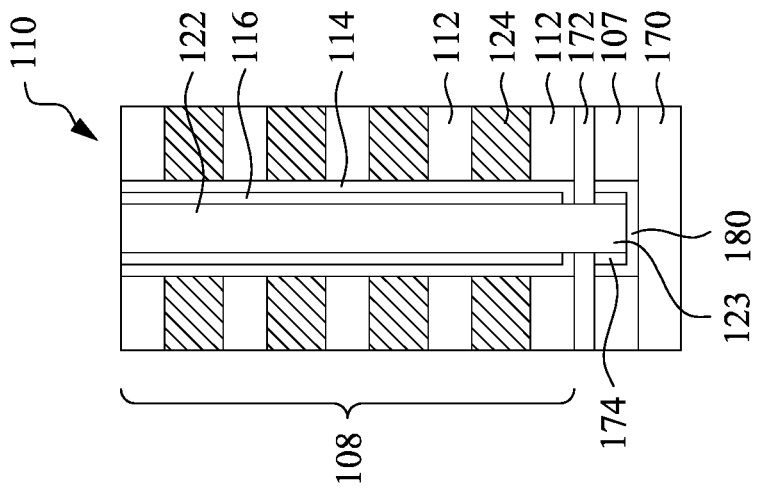
Figure 36A:
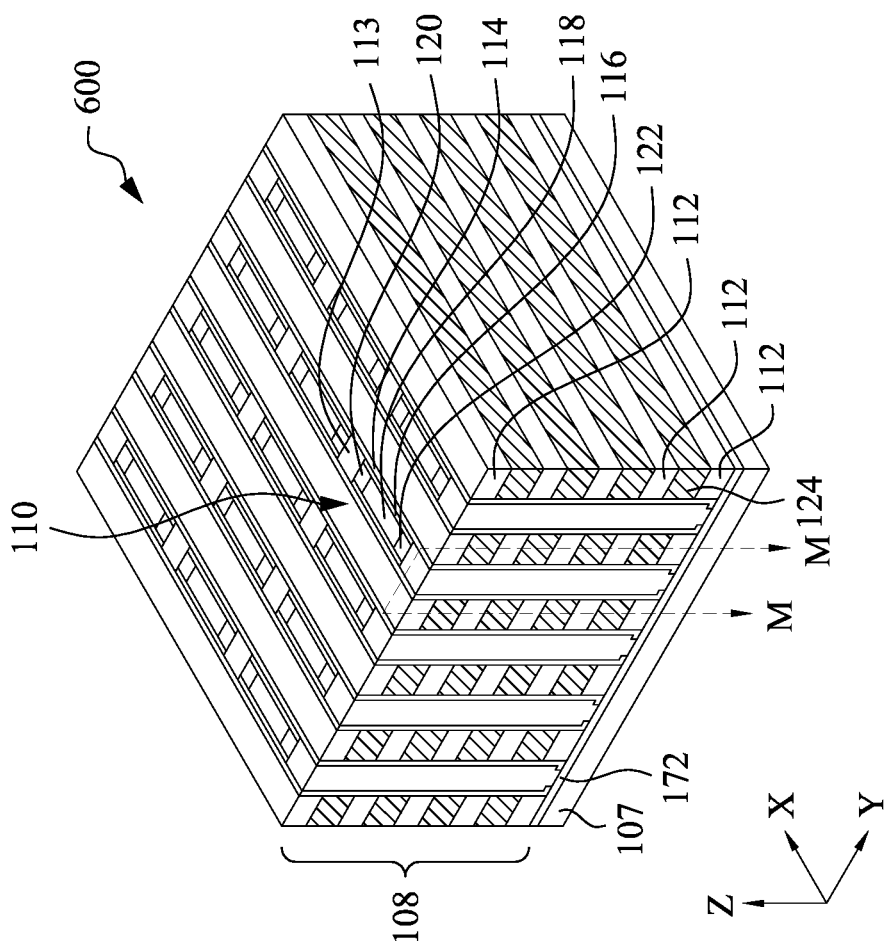

At operation 540, third cavities are etched at axial ends of the inner spacer structures through the inner spacer structures to form the inner spacers. At 542, openings are form through the etch stop layer at base of a set of the third cavities that correspond to the drains, and through the insulating material disposed in the internal cavity of the vias. At 544, a source and drain are formed. Corresponding to operation 540-544, FIG. 36A is a top, perspective view of the semiconductor die 600, and FIG. 36B is a side cross-section view of the semiconductor device of FIG. 36A taken along the line M-M shown in FIG. 36A, after forming the sources 120 and drains 122 so as to form an array of semiconductor devices 110 in the stack 108. To form the sources 120 and drains 122, third cavities may be formed at axial ends of the inner spacer structures 121 in the X-direction to form inner spacers 118 by etching through the inner spacer structure 121 in the Z-direction. The third cavities may be formed using a dry etch, for example, a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BC_{13}$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the third cavities. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process.

Openings are formed through the etch stop layer 172 and the insulating material 174 at base of a set of the third cavities that correspond to a location where the drains 122 are intended to be formed. The etch stop layer 172 may be etched using a wet process (e.g., an aqueous etchant such as hydrofluoric acid, nitric acid, phosphoric acid, any other suitable wet etchant or a combination thereof), or a dry etch, for example, a plasma etching process (including radical plasma etching, remote plasma etching, and other suitable plasma etching processes, ME, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the openings through the etch stop layer 172. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process.

Sources 120 and drains 122 are formed by filling the third cavities with the source and the drain material, respectively. The sources 120 and the drains 122 may be formed by depositing the drain material in the third cavities using an epitaxial growth process, PVD, CVD, LPCVD, PECVD, ALD, MBE, any other suitable process or a combination thereof, a HARP, another applicable process, or combinations thereof. In-situ doping (ISD) may be applied to form doped sources 120 or drains 122, thereby creating the junctions for each semiconductor device 110. N-type devices can be formed by implanting arsenic (As) or phosphorous (P), and p-type devices can be formed by implanting boron (B). The sources 120 and drains 122 are located at opposite axial ends of corresponding inner spacers 118. Portions of radially outer surface of the sources 120 and drains 122 are in contact with corresponding portions of a radially inner surface of the channel layer 116. A CMP operation may be performed after forming the drains 122a/b to planarize the top surface of the semiconductor die 600. As shown in FIG. 36B, the axial end 123 of the drain 122 extends through the etch stop layer 172 and the insulating material 174 and contacts the via 180 so as to be electrically coupled to a corresponding global drain line 170 through the via 180 as previously described herein. The area of an axial end of the drain 122 that contacts a surface of the via defines the contact area of the drain 122 with the via 180.

Figure 37:
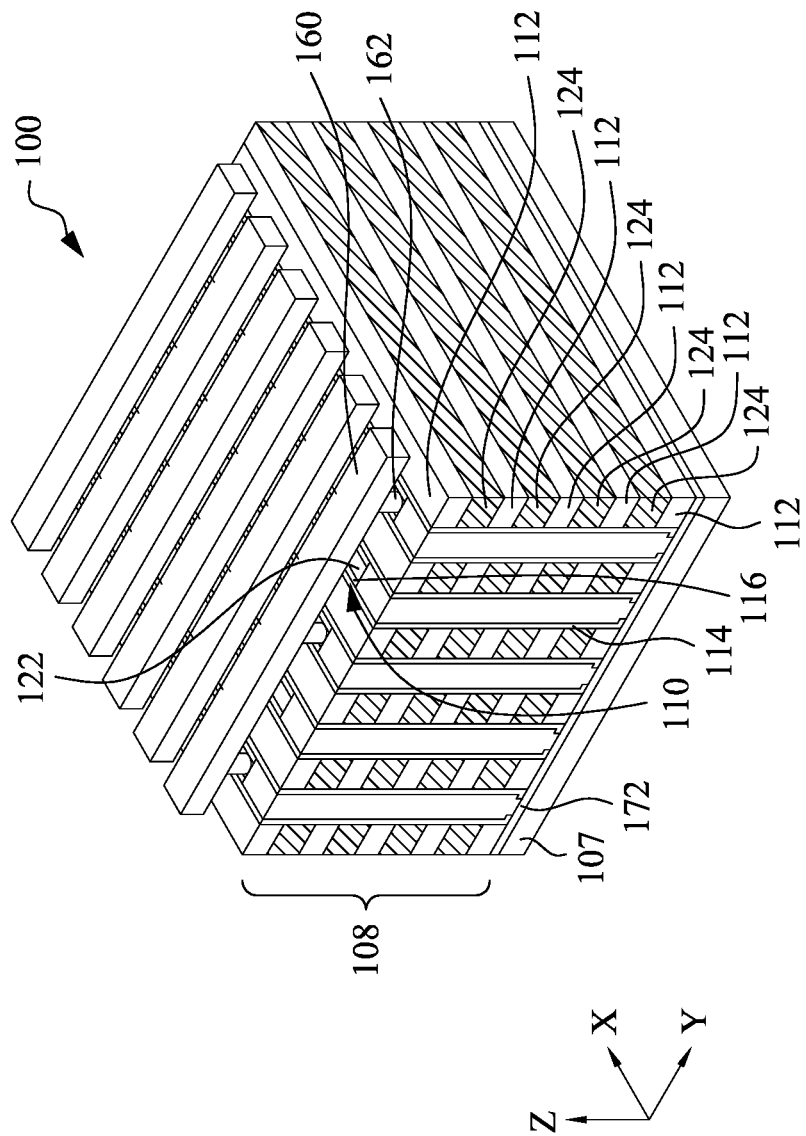

At operation 546, global source lines are formed on a top surface of the stack and electrically coupled to corresponding sources. Corresponding to operation 546, FIG. 37 is a top, perspective view of the semiconductor die 600 after forming the global source lines 160. In some embodiments, to form the global source lines, source vias 162 are formed on a top surface of the source 120. The source via may be formed from a conducting material for example, tungsten (W), copper (Cu), cobalt (Co), etc. In some embodiments, the source vias 162 may be formed using a dual damascene process. For example, a fourth cavity may be formed in the source 120. In some embodiments, a spacer layer may deposited on a top surface of the semiconductor die 600 (e.g., a top surface of the topmost insulating layer 112) and throughholes formed in the spacer layer at locations corresponding to the source vias 162.

In some embodiments, a diffusion barrier (e.g., a Ta based material) may be deposited in each of the fourth cavities, and a thin metal (e.g., Cu) seed layer is deposited on the diffusion barrier (e.g., using PVD, CVD, MBE, ALD, etc.). This is followed by electroplating of the metal (e.g., Cu) on the metal seed layer until the metal fills the trenches and projects axially upwards of the source 120. This process can be repeated until the source vias 162 having a desired height are obtained. The sacrificial layer may be removed before or after forming the various through vias, or after forming the through via caps, or be left disposed on the top surface of the semiconductor die 600.

The plurality of global source lines 160 are formed that are coupled to a set of the source vias 162 and thereby, a set of sources 120. Each of the global source lines 160 extends in the Y-direction. The global source lines 160 may be formed from a conducting material, for example, tungsten (W), copper (Cu), cobalt (Co), etc. The global source lines 160 may also be formed using a dual damascene process, for example, after formation of the source vias 162 before removing the spacer layer. While the semiconductor die 600 is shown without the spacer layer, in some embodiments, the spacer layer may remain included in the final semiconductor die 600. The global source lines 160 may be used to communicate an electrical signal (e.g., a current or voltage) to a corresponding source/s 120, and the global drain lines 170 may be used to receive an electrical signal (e.g., a current or voltage) from a corresponding drain 122, when the gate layer 124 is activated.

In some embodiments, a semiconductor device comprises a source, and a drain spaced apart from the source in a first direction. A channel layer is disposed on radially outer surfaces of the source and the drain in a second direction orthogonal to the first direction and extends in the first direction. A memory layer is disposed on a radially outer surface of the channel layer in the second direction and extends in the first direction. A via is disposed at an axial end of the drain in a vertical direction and configured to electrically couple the drain to a global drain line. The via comprises a via base extending in a plane defined by the first direction and the second direction, the via base structured to contact the corresponding global drain line, and via sidewalls extending from outer peripheral edges of the via base towards the drain such that the via defines an internal cavity within which at least a portion of an axial end of the drain in the vertical direction is disposed.

In some embodiments, a semiconductor die comprises a dielectric layer, a plurality of vias formed through the dielectric layer, each of the plurality of vias having a cup shape and defining an internal cavity, and a plurality of global drain lines disposed on a first side of the dielectric layer in a vertical direction, each of the plurality of global drain lines coupled to a portion of the plurality of vias. A stack is disposed on a second side of the dielectric layer opposite the first side, the stack comprising a plurality of gate layers and a plurality of insulation layers alternatively stacked on top of one another in the vertical direction. An array of semiconductor devices is formed through the stack. Each of the array of semiconductor devices comprises a source, a drain spaced apart from the source in a first direction, a channel layer disposed on radially outer surfaces of the source and the drain in a second direction orthogonal to the first direction and extending in the first direction, and a memory layer disposed on a radially outer surface of the channel layer in the second direction and extending in the first direction. An axial end of the drain of each of the array semiconductor devices extends through the stack to the corresponding via and contacts the corresponding via such that at least a portion of an axial end is disposed in the internal cavity defined by the via.

In some embodiments, a method of making a semiconductor die comprises forming a plurality of global drain lines, depositing a dielectric layer on the global drain lines, and forming a plurality of vias through the dielectric layer such that a portion of each of the plurality of vias contacts a corresponding global drain line of the plurality of global drain lines, each of the plurality of vias having a cup shape and defining an internal cavity. The method also comprises depositing an etch stop layer over the dielectric layer opposite the plurality of global drain lines, forming a stack comprising a plurality of insulating layer and a plurality of sacrificial layers alternatively stacked on top of each other on the etch stop layer, replacing the plurality of sacrificial layers with a plurality of gate layers, and forming a plurality of memory layers extending in a first direction. The method also comprises forming a plurality of channel layers extending in the first direction, and forming a source and a drain spaced apart from the source in the first direction such that the channel layer is disposed on radially outer surface of the source and the drain in the first direction. An axial end of the drain extends through the stack to a corresponding via and contacts the corresponding via such that at least a portion of the axial end of each drain is disposed in the internal cavity defined by the corresponding via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a source;
a drain spaced apart from the source in a first direction;
a channel layer disposed on radially outer surfaces of the source and the drain in a second direction orthogonal to the first direction and extending in the first direction;
a memory layer disposed on a radially outer surface of the channel layer in the second direction and extending in the first direction; and
a via disposed at an axial end of the drain in a vertical direction and configured to electrically couple the drain to a corresponding global drain line, the via comprising:

a via base extending in a plane defined by the first direction and the second direction, the via base structured to contact the corresponding global drain line, and via sidewalls extending from outer peripheral edges of the via base towards the drain such that the via defines an internal cavity within which at least a portion of the axial end of the drain in the vertical direction is disposed.

2. The semiconductor device of claim 1, wherein the volume of the internal cavity of the via surrounding the axial end of the drain is filled with an insulating material.

3. The semiconductor device of claim 1, wherein the drain is axially aligned with the via such that radially outer surfaces of the drain are radially inwards of the via sidewalls.

4. The semiconductor device of claim 1, wherein the drain is axially offset from the via such that a radially outer surface of the drain contacts at least one of the via sidewalls.

5. The semiconductor device of claim 4, wherein a portion of an axial end surface of the drain is disposed on and contacts an axial end surface of the at least one of the via sidewalls that is distal from the via base.

6. The semiconductor device of claim 1, wherein the via sidewalls are oriented at an angle of about 90 degrees with respect to the via base.

7. The semiconductor device of claim 6, wherein a width of the via defined by a distance between opposing via sidewalls in the first direction or the second direction is larger than a width of the drain in the first direction or the second direction.

8. The semiconductor device of claim 1, wherein the via sidewalls are oriented at an angle of greater than 90 degrees with respect to the via base.

9. The semiconductor device of claim 1, wherein the via sidewalls include a via sidewall first portion oriented at an angle of greater than 90 degrees with respect to the via base, and a via sidewall second portion extending vertically from an axial end of the via sidewall first portion away from the via base.

10. The semiconductor device of claim 1, wherein the via sidewalls include a via sidewall first portion oriented at an angle of about 90 degrees with respect to the via base, and a via sidewall second portion extending from an axial end of the via sidewall first portion away from the via base, the via sidewall second portion oriented at an angle of greater than 90 degrees with respect to the via base.

11. A semiconductor die, comprising:
a dielectric layer;
a plurality of vias formed through the dielectric layer, each of the plurality of vias having a cup shape and defining an internal cavity;
a plurality of global drain lines disposed on a first side of the dielectric layer in a vertical direction, each of the plurality of global drain lines coupled to a portion of the plurality of vias;
a stack disposed on a second side of the dielectric layer opposite the first side, the stack comprising a plurality of gate layers and a plurality of insulation layers alternatively stacked on top of one another in the vertical direction; and
an array of semiconductor devices formed through the stack, each of the array of semiconductor devices comprising:
a source,
a drain spaced apart from the source in a first direction,
a channel layer disposed on radially outer surfaces of the source and the drain in a second direction orthogonal to the first direction and extending in the first direction, and
a memory layer disposed on a radially outer surface of the channel layer in the second direction and extending in the first direction,
wherein an axial end of the drain of each of the array of semiconductor devices extends through the stack to a corresponding via and contacts the corresponding via such that at least a portion of the axial end is disposed in the internal cavity defined by the corresponding via.

12. The semiconductor die of claim 11, further comprising:
an etch stop layer interposed between the dielectric layer and the stack,
wherein the axial end of the drain extends through the etch stop layer to the corresponding via.

13. The semiconductor die of claim 12, wherein an axial end of the memory layer in the vertical direction is disposed on a first surface of the etch stop layer distal from the dielectric layer.

14. The semiconductor die of claim 12, wherein the via comprises:
a via base extending in a plane defined by the first direction and the second direction, the via base contacting a corresponding global drain line of the plurality of global drain lines; and
via sidewalls extending from outer peripheral edges of the via base towards the etch stop layer and contacting the etch stop layer.

15. The semiconductor die of claim 14, wherein the via sidewalls are oriented at an angle of about 90 degrees with respect to the via base.

16. The semiconductor die of claim 14, wherein the via sidewalls are oriented at an angle of greater than 90 degrees with respect to the via base.

17. The semiconductor die of claim 14, wherein the via sidewalls include a via sidewall first portion oriented at an angle of greater than 90 degrees with respect to the via base, and a via sidewall second portion extending vertically from an axial end of the via sidewall first portion away from the via base.

18. The semiconductor die of claim 14, wherein the via sidewalls include a via sidewall first portion oriented at an angle of about 90 degrees with respect to the via base, and a via sidewall second portion extending from an axial end of the via sidewall first portion away from the via base, the via sidewall second portion oriented at an angle of greater than 90 degrees with respect to the via base.

* * * * *